(12) United States Patent
Abe

(10) Patent No.: US 11,024,639 B2
(45) Date of Patent: Jun. 1, 2021

(54) METHOD OF MANUFACTURING SEMICONDUCTOR DEVICE

(71) Applicant: RENESAS ELECTRONICS CORPORATION, Tokyo (JP)

(72) Inventor: Shinichiro Abe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/243,809

(22) Filed: Jan. 9, 2019

(65) Prior Publication Data

US 2019/0244968 A1 Aug. 8, 2019

(30) Foreign Application Priority Data

Feb. 5, 2018 (JP) .............................. JP2018-018564

(51) Int. Cl.
*H01L 27/11573* (2017.01)
*H01L 27/11568* (2017.01)

(52) U.S. Cl.
CPC .. *H01L 27/11573* (2013.01); *H01L 27/11568* (2013.01)

(58) Field of Classification Search
None
See application file for complete search history.

(56) References Cited

U.S. PATENT DOCUMENTS

| 6,268,266 B1* | 7/2001 | Hwang | H01L 21/76202 |
| | | | 257/E21.552 |
| 6,906,387 B1* | 6/2005 | Reese | H01L 27/0266 |
| | | | 257/173 |
| 7,011,999 B2 | 3/2006 | Minami et al. | |
| 9,218,978 B1* | 12/2015 | Ramkumar | H01L 29/40117 |
| 2010/0255647 A1* | 10/2010 | Yamakoshi | H01L 27/11546 |
| | | | 438/211 |
| 2012/0187469 A1* | 7/2012 | Sekine | H01L 21/26506 |
| | | | 257/321 |

FOREIGN PATENT DOCUMENTS

| JP | 2004-200504 A | 7/2004 |
| JP | 2008-218852 A | 9/2008 |

* cited by examiner

*Primary Examiner* — Xiaoming Liu
(74) *Attorney, Agent, or Firm* — McDermott Will & Emery LLP

(57) ABSTRACT

Reliability of a semiconductor device is improved. A resist pattern having an opening in a first region where a memory transistor is formed and covering other regions is prepared. Next, by ion implantation using this resist pattern as a mask, a channel region is formed in a surface of a semiconductor substrate in the first region, and a nitrogen-introduction portion is formed inside the channel region. Next, the resist pattern is removed. Then, a gate insulating film having a charge storage layer is formed on the semiconductor substrate in the first region, and a gate electrode is formed on the gate insulating film.

15 Claims, 31 Drawing Sheets

|  | WRITING OPERATION(V) | ERASING OPERATION(V) | READING OPERATION(V) |
|---|---|---|---|
| MG0 | 6.5 | −3.5 | 0 |
| CG0 | −3.5 |  | 3.3 |
| SL0 | 0 | 3.3 | 0 |
| BL0 | −3.5 | Open | 0.8 |
| MG1 | −1.5 | 6.5 | 0 |
| CG1 | −3.5 | 3.3 | 0 |
| SL1 | 0 | Open | 0 |
| BL1 | 1.5 | Open | 0 |
| PW | −3.5 | 6.5 | 0 |

METHOD OF MANUFACTURING SEMICONDUCTOR DEVICE

CROSS-REFERENCE TO RELATED APPLICATION

The present application claims priority from Japanese Patent Application No. 2018-18564 filed on Feb. 5, 2018, the content of which is hereby incorporated by reference into this application.

TECHNICAL FIELD OF THE INVENTION

The present invention relates to a method of manufacturing a semiconductor device, and relates to a technique effectively applied to, for example, a semiconductor device having a non-volatile memory cell.

BACKGROUND OF THE INVENTION

As a non-volatile memory cell to/from which data can be electrically written/erased, an EEPROM (Electrically Erasable and Programmable Read Only Memory) and a flash memory are widely used. Each of these non-volatile memory cells has a floating gate electrode or a trap insulating film under a gate electrode of a MISFET (Metal Insulator Semiconductor Field Effect Transistor) so as to be sandwiched by the gate electrode and an insulating film such as a silicon oxide film, and a state of charges stored in the floating gate electrode or the trap insulating film correspond to storage information. This trap insulating film means an insulating layer in which the charges can be stored, and a silicon nitride film and others are cited as one example. As such a non-volatile memory cell, a MONOS (Metal-Oxide-Nitride-Oxide-Semiconductor) transistor is widely used.

For example, Japanese Patent Application Laid-Open Publication No. 2004-200504 (Patent Document 1) discloses a technique of forming two types of transistors having different breakdown voltages from each other and a MONOS type transistor on a semiconductor substrate.

For example, Japanese Patent Application Laid-Open Publication No. 2008-218852 (Patent Document 2) discloses a technique of implanting fluorine into an n-type well where a p-MOS is formed and implanting nitrogen into a p-type well where an n-MOS is formed.

SUMMARY OF THE INVENTION

In a gate insulating film of the MONOS type transistor, a silicon oxide film to be a lower-layer film is formed on a semiconductor substrate first, a silicon nitride film to be a charge storage layer is formed on the lower-layer film, and a silicon oxide film to be an upper-layer film is formed on the charge storage layer. In this case, in order to improve a non-volatile memory cell property such as retention, nitrogen is introduced into an interface between the lower-layer film and the semiconductor substrate. However, if the nitrogen is introduced into not only the lower-layer film of the MONOS type transistor but also a gate insulating film of a different MISFET that is formed in a different region from that of the MONOS type transistor, there is a risk of change or deterioration of a property of the different MISFET.

Other object and novel characteristics will be apparent from the description of the present specification and the accompanying drawings.

According to one embodiment, a method of manufacturing a semiconductor device has: (a) a step of forming a first well of a first conductivity type in a semiconductor substrate; and (b) a step of forming a first resist pattern having an opening on the semiconductor substrate in a first region and covering an upper portion of the semiconductor substrate in a second region. And, the method of manufacturing the semiconductor device has: (c) a step of forming a first channel region of a first MISFET on a surface of the first well in the first region by ion implantation of an impurity of a second conductivity type that is opposite to the first conductivity type, using the first resist pattern as a mask; and (d) a step of forming a nitrogen-introduction portion inside the first channel region by ion implantation of nitrogen using the first resist pattern as a mask.

According to one embodiment, reliability of the semiconductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail on the basis of the accompanying drawings. Note that components having the same function are denoted by the same reference symbols throughout all the drawings for describing the embodiments, and the repetitive description thereof will be omitted. In addition, the description of the same or similar portions is not repeated in principle unless particularly required in the following embodiments.

Further, in some drawings used in the embodiments, hatching is omitted so as to make the drawings easy to see in some cases.

First Embodiment

Figure 1:
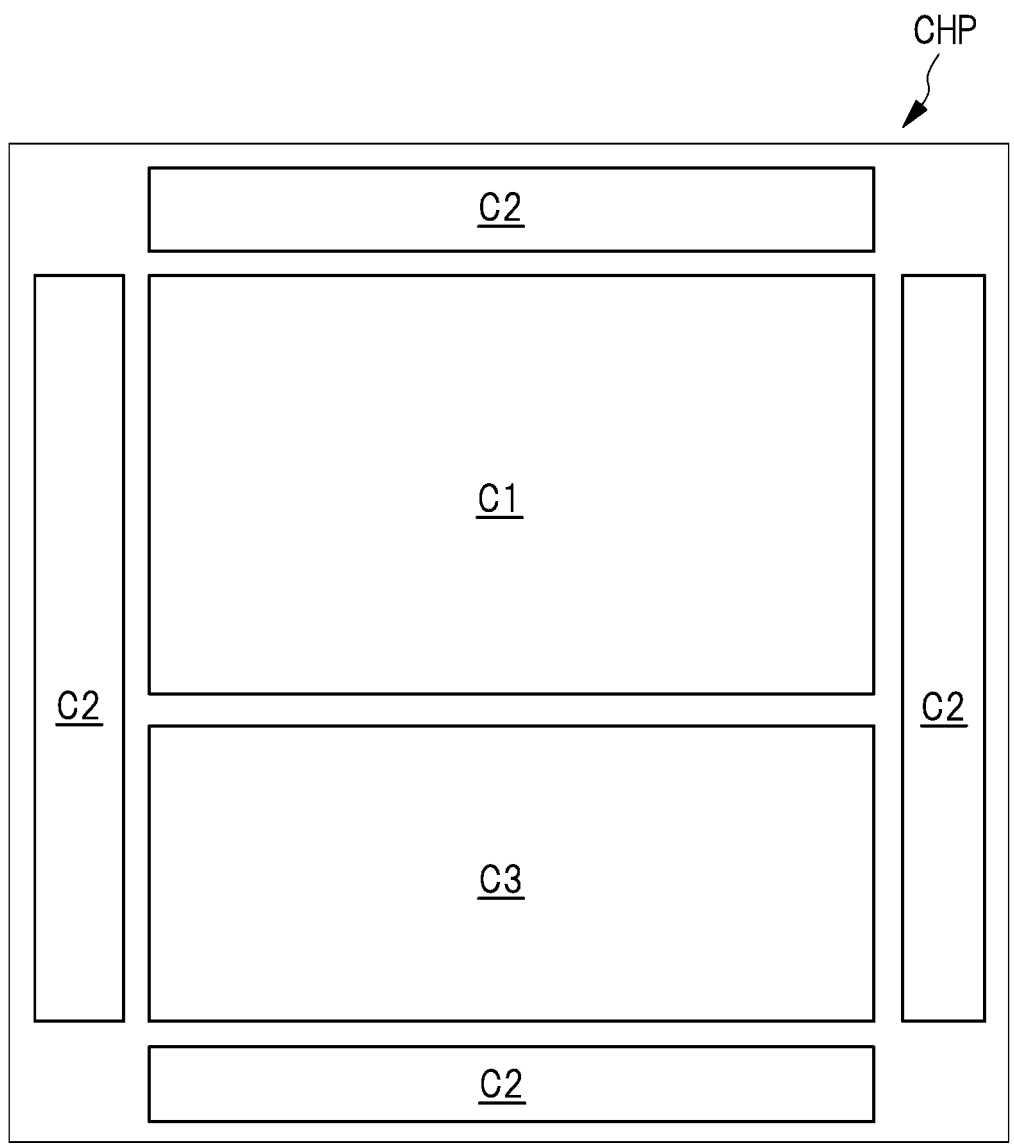
FIG. 1 is a circuit block diagram showing a layout of a semiconductor chip that is a semiconductor device according to an embodiment.

FIG. 1 is a circuit block diagram showing a rough layout of a semiconductor chip "CHP" that is a semiconductor device according to the present embodiment.

A circuit block "C1" is a region which configures non-volatile memory circuits such as an EEPROM and a flash memory and where a plurality of memory cells "MC" are formed as a semiconductor element.

A circuit block "C2" is a region which configures an I/O (Input/Output) circuit and where a high-breakdown-voltage MISFET being driven at a voltage of about 3.3 V is formed as a semiconductor element.

A circuit block "C3" is a region which configures a logic circuit including a CPU (Central Processing Unit) and an SRAM (Static Random Access Memory) and where a low-breakdown-voltage MISFET having a lower breakdown voltage than that of a high-breakdown-voltage MISFET and being driven at a voltage of about 1.2 V is formed as a semiconductor element.

Figures 2, 3:
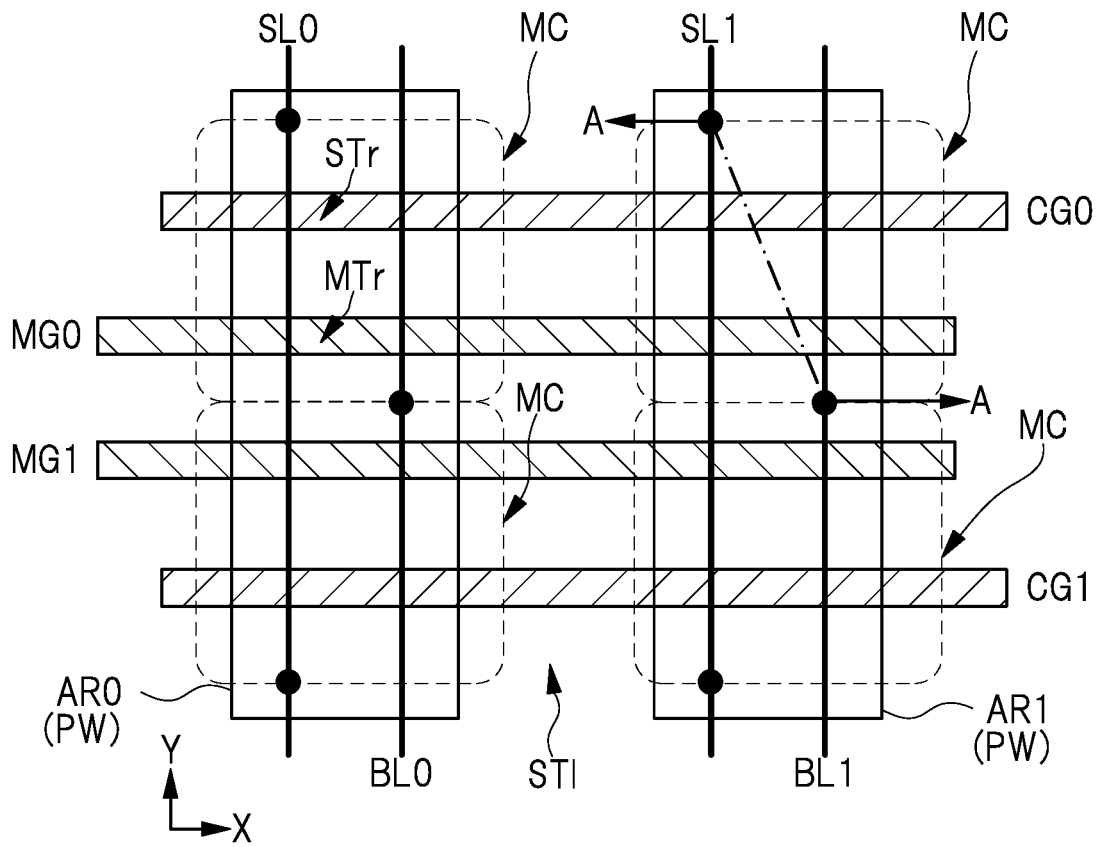
FIG. 2 is a plane layout diagram of memory cells of a part of a non-volatile memory circuit.
FIG. 3 is a diagram showing an operational voltage of a memory cell.

FIG. 2 shows a part of a non-volatile memory circuit of the circuit block C1, which shows a simple plane layout diagram of four memory cells (non-volatile memory cells) MC. Although FIG. 2 is a plan view, note that hatching is added to memory gate lines MG0 and MG1 and control gate lines CG0 and CG1 so as to make the drawing easy to see.

For example, an upper left memory cell "MC" includes a memory transistor "MTr" and a selection transistor "STr" as the MISFETs, and is connected to the memory gate line MG0, the control gate line CG0, a bit line "BL0" and a source line "SL0".

A plurality of memory cells MC are formed in active regions "AR0" and "AR1" isolated by an element isolating portion "STI". The active regions "AR0" and "AR1" are a region where a diffusion region "MS" and an impurity region "LMS" are formed, the diffusion region MS and the impurity region LMS being connected to the source lines SL0 and SL1 and becoming a source region of the memory cell MC, and a region where a diffusion region "MD" and an impurity region "LMD" are formed, the diffusion region MD and the impurity region LMD being connected to the bit lines BL0 and BL1 and becoming a drain region of the memory cell MC and others, respectively. These regions will be explained below with reference to a region "1A" of FIG. 19 showing the cross-sectional view of the memory cell MC.

Figure 19:
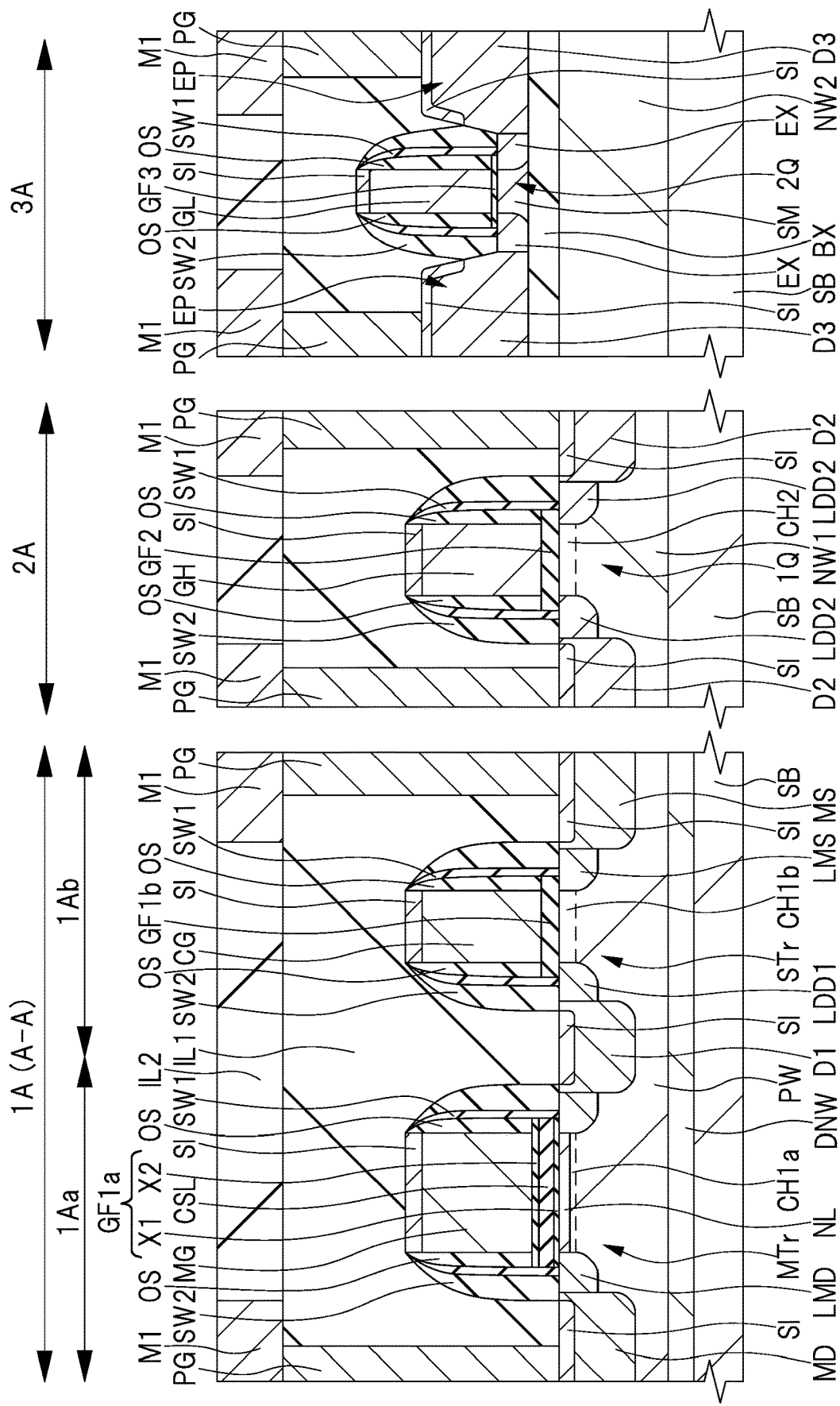
FIG. 19 is a cross-sectional view showing a manufacturing step of the semiconductor device, continued from FIG. 18.

Each of the memory gate lines MG0 and MG1 extends in an X direction, is connected to the memory cells MC that are adjacent to each other in the X direction, and is formed of a memory gate electrode "MG" of FIG. 19.

Each of the control gate lines CG0 and CG1 extends in the X direction, is connected to the memory cells MC that are adjacent to each other in the X direction, and is formed of a control gate electrode "CG" of FIG. 19.

Each of the bit lines BL0 and BL1 is a wiring extending in a Y direction, is connected to the memory cells MC that are adjacent to each other in the Y direction, and is electrically connected to the diffusion region MD and the impurity region LMD forming the drain region of FIG. 19. Note that the wiring forming each of the bit lines BL0 and BL1 is, for example, a wiring "M1" in FIG. 19 or a wiring (not illustrated) in an upper layer than the wiring M1.

Each of the source lines SL0 and SL1 is a wiring extending in the Y direction, is connected to the memory cells MC that are adjacent to each other in the Y direction, and is electrically connected to the diffusion region MS and the impurity region LMS forming the source region of FIG. 19. Note that the wiring forming each of the source lines SL0 and SL1 is, for example, the wiring "M1" in FIG. 19 or a wiring (not illustrated) in an upper layer than the wiring M1. And, although not illustrated, each of the source lines SL0 and SL1 is connected to a global source line so that a common potential is supplied.

In the active regions AR0 and AR1, a p-type well "PW" shown in FIG. 19 is formed.

FIG. 3 shows voltages applied to the memory gate lines MG0 and MG1, the control gate lines CG0 and CG1, the source lines SL0 and SL1, the bit lines BL0 and BL1 and the p-type well "PW" shown in FIG. 2 at the time of a writing operation, the time of an erasing operation and the time of a reading operation, respectively. Note that a state "Open" in the drawing means a floating state in which the voltage is not applied.

At the time of the writing operation, the upper left memory cell MC in FIG. 2 is selected, and a potential difference of 10 V is caused between the memory gate line MG0 and the well PW. As a result, electrons are injected from the entire surface of a channel region "CH1a" under the memory gate electrode MG into the charge storage layer CSL, so that the memory cell MC is in a writing state. That is, by the FN (Fowler-Nordheim) tunnel phenomenon, the writing operation is performed to the memory cell MC.

At the time of the erasing operation, the upper left and upper right memory cells MC in FIG. 2 are selected, and a potential difference of 10 V is caused between the memory gate line MG0 and the well PW. As a result, electrons stored in the charge storage layer CSL are released to a channel region under the memory gate electrode MG. That is, by the FN tunnel phenomenon, the erasing operation is performed to the memory cell MC.

At the time of the reading operation, the upper left memory cell MC in FIG. 2 is selected. At this time, the selection transistor STr is turned on. On the other hand, the memory transistor MTr is turned off if the electrons are being stored in the charge storage layer CSL, or the memory transistor MTr is turned on if the electrons are not being stored in the charge storage layer CSL. When it is determined whether or not a current flows in the selection transistor STr and the memory transistor MTr as described above, it can be determined that the memory cell MC is in either the writing state or the erasing state.

In the present embodiment, the channel region CH1a is a region containing a p-type impurity and an n-type impurity, and the channel region CH1a is comprehensively regarded as an n-type impurity region. Therefore, even if a voltage applied to the memory gate electrode MG at the time of the reading operation is 0 V, the reading operation can be performed. Note that the channel region CH1a may be comprehensively regarded as a p-type impurity region. In this case, the voltage applied to the memory gate electrode MG at the time of the reading operation is set to a positive voltage.

Although described in detail later, a main feature of the semiconductor device according to the present embodiment is that a nitrogen-introduction portion NL is selectively formed in the channel region CH1a of the memory transistor MTr by an ion implantation method. Hereinafter, a method of manufacturing the semiconductor device according to the present embodiment, study examples and the main feature of the present embodiment will be sequentially explained.

Method of Manufacturing Semiconductor Device

The method of manufacturing the semiconductor device according to the present embodiment will be explained below with reference to FIGS. 4 to 19. First, regions 1A to 3A shown in the drawings will be explained.

The region 1A is a region of the semiconductor chip CHP, where the memory cell MC that is a semiconductor element configuring the non-volatile memory circuit of the circuit block C1 is formed, and corresponds to a cross-sectional view taken along a line A-A of FIG. 2. The region 1A includes a region 1Aa and a region 1Ab, the region 1Aa is a region where the memory transistor MTr of the memory cell MC is formed, and the region 1Ab is a region where the selection transistor STr of the memory cell MC is formed.

The region 2A is a region of the semiconductor chip CHP, where a p-type MISFET "1Q" that is a high-breakdown-voltage MISFET of the circuit block C2 is formed. Note that an n-type high-breakdown-voltage MISFET is also formed in the circuit block C2. However, explanation for this portion is omitted here.

The region 3A is a region of the semiconductor chip CHP, where a p-type MISFET "2Q" that is a low-breakdown-voltage MISFET of the circuit block C3 is formed. Note that an n-type low-breakdown-voltage MISFET is also formed in the circuit block C3. However, explanation for this portion is omitted here.

Figure 4:
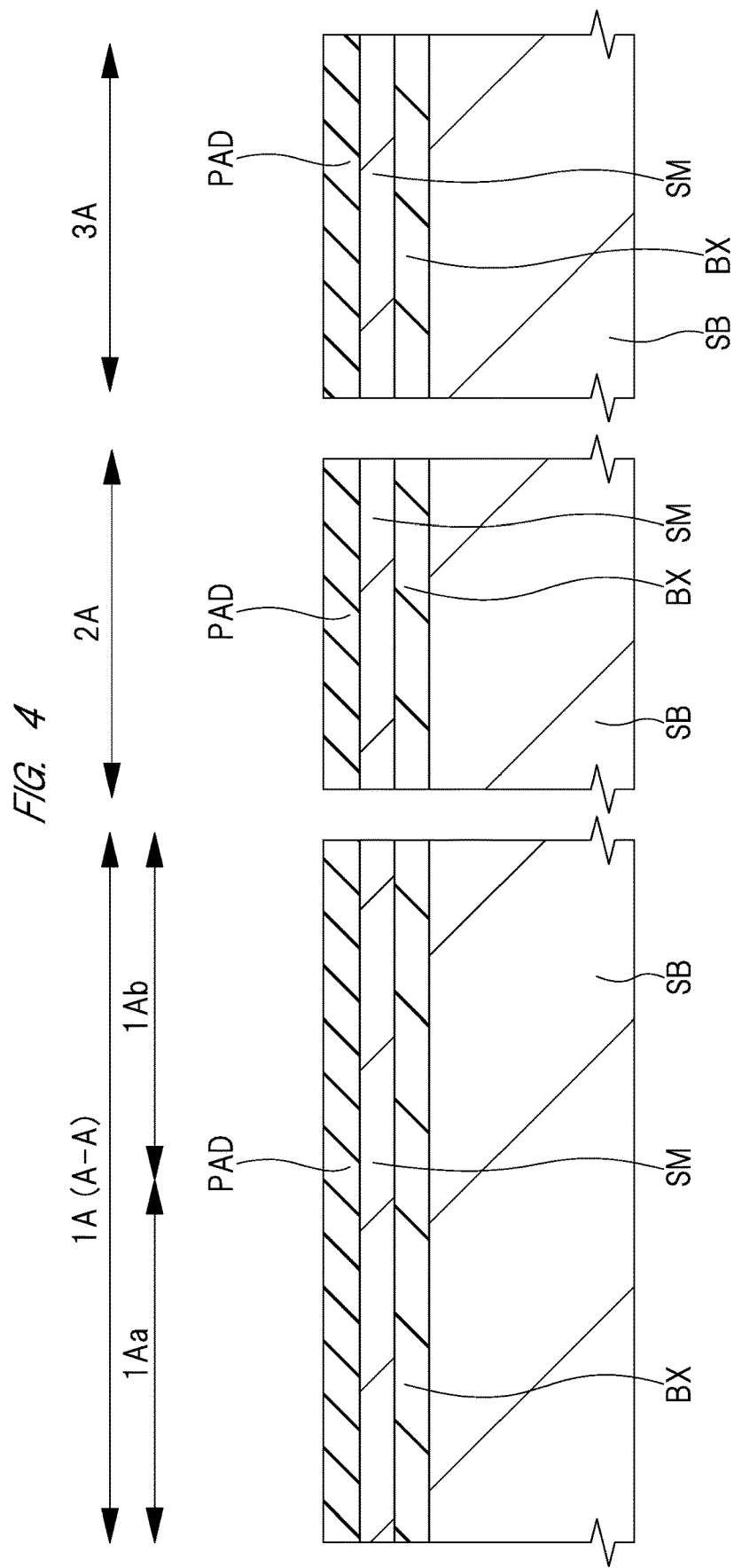
FIG. 4 is a cross-sectional view showing a manufacturing step of a semiconductor device according to a first embodiment.

FIG. 4 shows so-called "SOI" (Silicon On Insulator) substrate having: a semiconductor substrate "SB" that is a supporting substrate; an insulating layer "BX" formed on the semiconductor substrate SB; and a semiconductor layer "SM" formed on the insulating layer BX.

The semiconductor substrate SB is preferably made of single crystal silicon having a specific resistance of about 1 to 10 Ωcm, such as p-type single crystal silicon. The insulating layer BX is made of, for example, silicon oxide, and a thickness of the insulating layer BX is, for example, about 10 to 20 nm. The semiconductor layer SM is preferably made of single crystal silicon having a specific resistance of about 1 to 10 Ωcm, and a thickness of the semiconductor layer SM is, for example, about 10 to 20 nm. Note that impurities are not introduced into the semiconductor layer SM by the ion implantation or others.

One example of steps of preparing such an SOI substrate will be explained below. The SOI substrate is formed by, for example, a bonding method. In the bonding method, for example, the insulating layer BX is formed by oxidizing a surface of a first semiconductor substrate made of silicon, and then, a second semiconductor substrate made of silicon is compressed onto the first semiconductor substrate under a high temperature to be bonded thereto. Then, the second semiconductor substrate is thinned. As a result, a thin film of the second semiconductor substrate remaining over the insulating layer BX becomes the semiconductor layer SM, and the first semiconductor substrate under the insulating layer BX becomes the semiconductor substrate SB.

Next, on the semiconductor layer SM, an insulating film "PAD" made of, for example, silicon oxide is formed by, for example, a CVD (Chemical Vapor Deposition) method.

Figure 5:
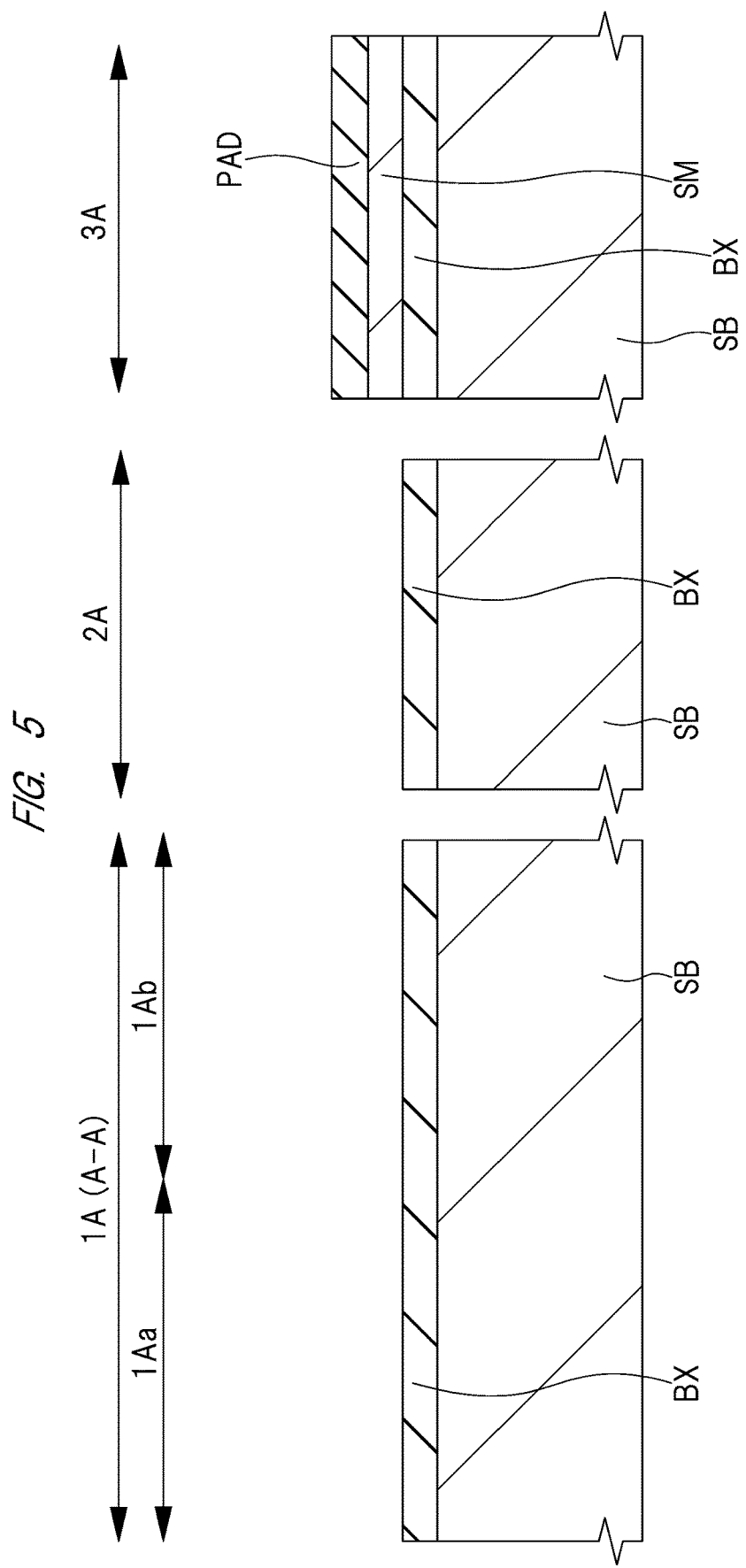
FIG. 5 is a cross-sectional view showing a manufacturing step of the semiconductor device, continued from FIG. 4.

FIG. 5 shows a step of removing the insulating film PAD and the semiconductor layer SM.

First, an element isolating portion STI is formed by formation of a trench that passes through the insulating film PAD, the semiconductor layer SM, the insulating layer BX and the semiconductor substrate SB by a photolithography method and a dry etching process, and then, by infilling of this trench with an insulating film. Although the element isolating portion STI is not illustrated in FIG. 5, the regions 1A to 3A are isolated from one another by the element isolating portion STI. Also in other cross-sectional views of FIGS. 6 to 20 and others, note that the illustration of the element isolating portion STI is omitted.

Next, by a photolithography method and an etching process, the insulating film PAD and the semiconductor layer SM in the regions 1A and 2A are selectively sequentially removed so that the insulating film PAD and the semiconductor layer SM in the region 3A remain. In this manner, the insulating layers BX in the regions 1A and 2A are exposed.

Figure 6:
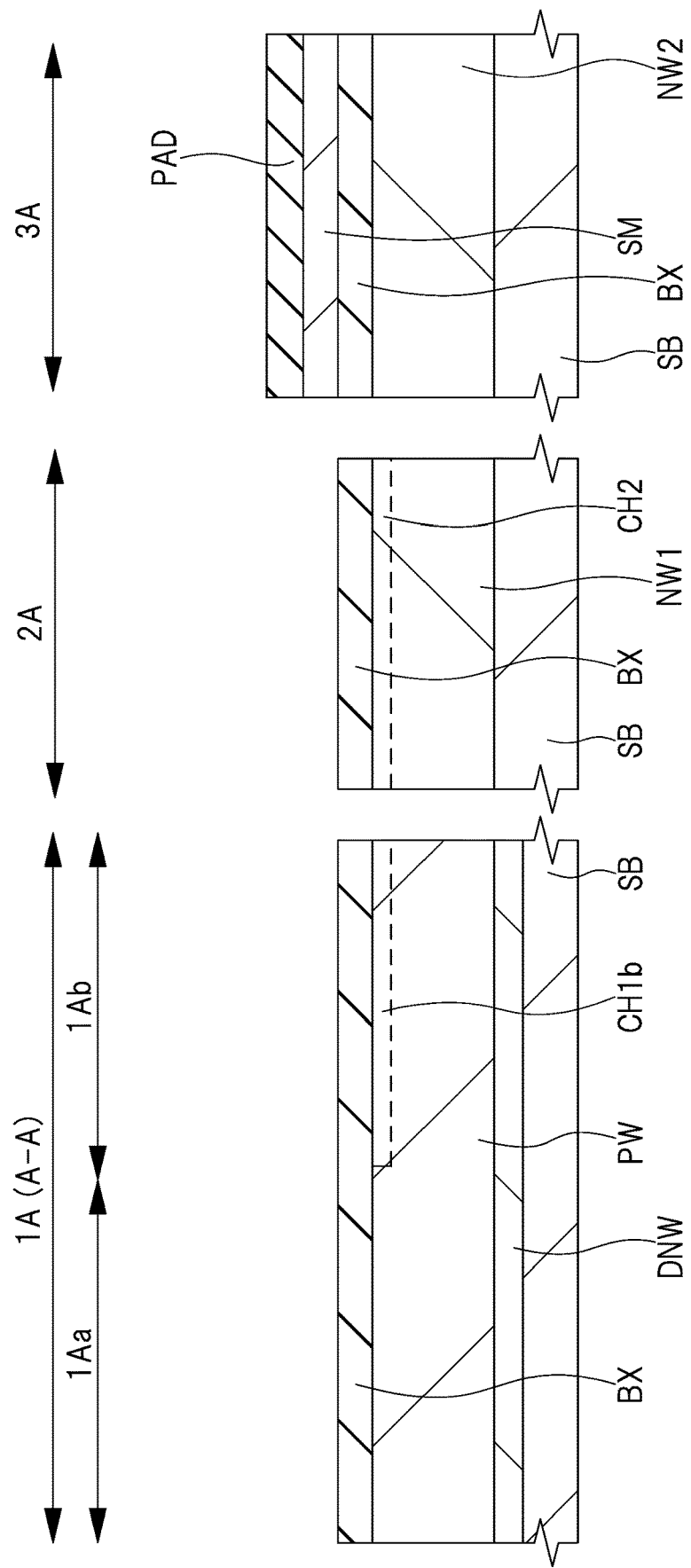
FIG. 6 is a cross-sectional view showing a manufacturing step of the semiconductor device, continued from FIG. 5.

FIG. 6 shows a step of forming a well "DNW", a well "PW", a well "NW1", a well "NW2", a channel region "CH1$b$" and a channel region "CH2".

First, by a photolithography method and an ion implantation method, an n-type well DNW is formed in the semiconductor substrate SB in the region 1A.

Next, by a thermal process to the semiconductor substrate SB, impurities contained in the well DNW are activated. This thermal process for the activation is performed under a condition, for example, at 1100° C. for about 2 hours.

Next, by a photolithography method and an ion implantation method, a p-type well PW is formed inside the well DNW in the region 1A, an n-type well NW1 is formed in the semiconductor substrate SB in the region 2A, and an n-type well NW2 is formed in the semiconductor substrate SB in the region 3A. And, ion implantation for threshold adjustment and others is performed to a surface of the well NW1 in the region 2A and a surface of the well PW in the region 1Ab of the region 1A, so that the channel region CH2 is formed in the well NW1, and the channel region CH1$b$ is formed in the well PW. In the drawings, each channel region such as the channel region CH1$b$ and the channel region CH2 is illustrated with a broken line. In the present embodiment, at this stage, the ion implantation for the threshold adjustment is not performed to a surface of the well PW in the region 1Aa.

The well NW2 in the region 3A is a region functioning as a gate of the MISFET 2Q together with a gate electrode "GL" described later, and is a region for controlling the threshold value of the MISFET 2Q by application of a voltage to the well NW2, the voltage being independent from that of the gate electrode GL. Note that a power supply region is formed by removing a part of the semiconductor layer SM and the insulating layer BS in the region 3A to expose the well NW2 in order to apply the voltage to the well NW2. However, explanation for the power supply region is omitted here. And, a higher-content p-type impurity region than that of the well NW2 may be formed in a surface of the well NW2 being in contact with the insulating layer BX.

Next, by a thermal process to the semiconductor substrate SB, impurities contained in each well and each channel region are activated. This thermal process for the activation is performed under a condition, for example, at 950° C. for about 1 minute.

Figure 7:
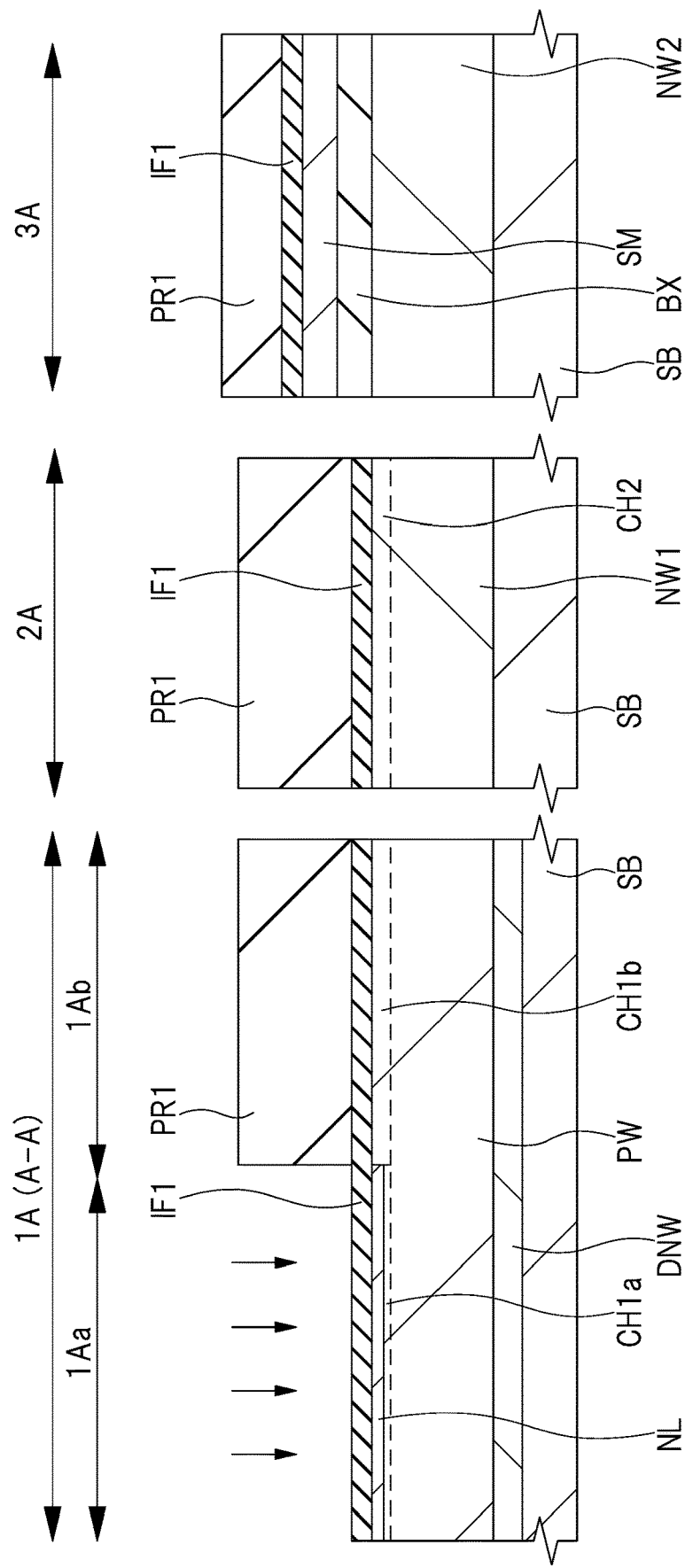
FIG. 7 is a cross-sectional view showing a manufacturing step of the semiconductor device, continued from FIG. 6.

FIG. 7 shows a step of removing the insulating film PAD and the insulating layer BS and forming an insulating film "IF1", a resist pattern "PR1", the channel region CH1$a$ and the nitrogen-introduction portion NL.

First, by a wet etching process using solution containing hydrofluoric acid, the insulating layer BX remaining in the regions 1A and 2A and the insulating film PAD remaining in the region 3A are removed. In this manner, the semiconductor substrate SB is exposed in the regions 1A and 2A, and the semiconductor layer SM is exposed in the region 3A.

Next, on the semiconductor substrate SB in the regions 1A and 2A and on the semiconductor layer SM in the region 3A, the insulating film IF1 made of, for example, silicon oxide is formed by, for example, a thermal oxidation method. The insulating film IF1 is a film that is a main portion of a gate insulating film "GF1$b$" of the selection transistor STr and a gate insulating film "GF2" of the MISFET 1Q in a later step, and a thickness of the insulating film IF1 is about 8 nm.

Next, the resist pattern PR1 having an opening in the region 1Aa and covering the regions 1Ab, 2A and 3A is formed.

Next, the ion implantation for the threshold adjustment of the memory transistor MTr is performed. First, by ion implantation using the resist pattern PR1 as a mask, the channel region CH1$a$ is formed in a surface of the well PW in the region 1Aa. This ion implantation is performed by using, for example, arsenic (As) under a condition in which, for example, an implantation energy is 25 keV and a dose amount is equal to or smaller than $2.0 \times 10^{12}/cm^2$. By this ion implantation, a type of the surface of the well PW becomes an n-type. That is, the channel region CH1$a$ is a region containing the p-type impurity and the n-type impurity. In the present embodiment, the channel region CH1$a$ is the n-type impurity region at the end. However, the channel region CH1$a$ may be the p-type impurity region by adjustment of the arsenic dose amount.

Next, by ion implantation using the resist pattern PR1 as a mask, nitrogen is introduced to the surface of the channel region CH1$a$, so that the nitrogen-introduction portion NL is formed. This ion implantation is performed by using, for example, nitrogen (N) under a condition in which, for example, an implantation energy is 10 keV and a dose amount is in a range from $5 \times 10^{14}$ to $1 \times 10^{15}/cm^2$ or an implantation energy is 6 keV and a dose amount is in a range from $1 \times 10^{14}$ to $5 \times 10^{14}/cm^2$. This ion implantation using nitrogen is performed to only the region 1A but not performed to other regions.

At this stage, note that the resist pattern PR1 is not removed and remains.

Figure 8:
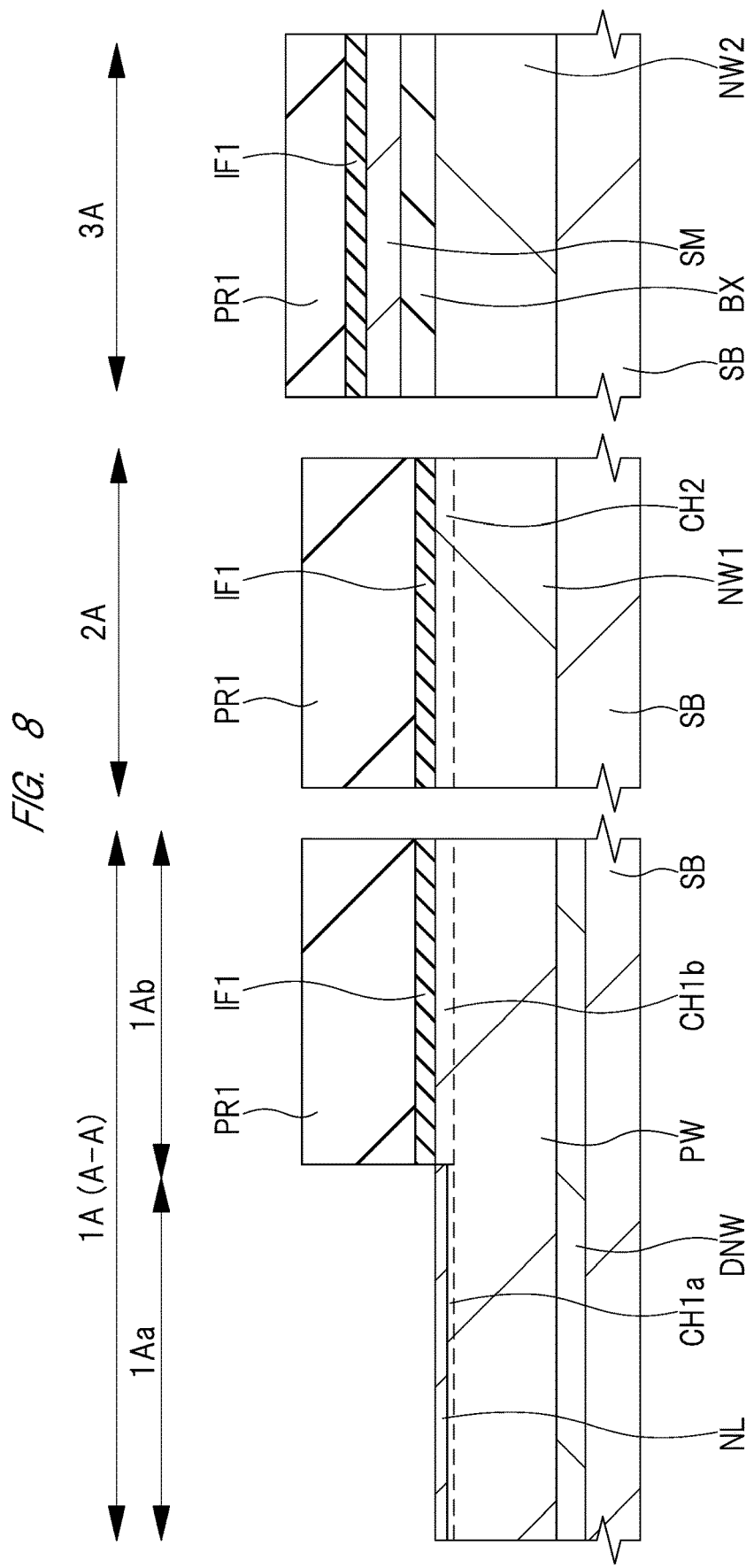
FIG. 8 is a cross-sectional view showing a manufacturing step of the semiconductor device, continued from FIG. 7.

FIG. 8 shows a step of removing the insulating film IF1.

By an etching process using the resist pattern PR1 used in the step of FIG. 7 as a mask, the insulating film IF1 is selectively removed in the region 1Aa to expose the semiconductor substrate SB. This etching process is performed as, for example, a dry etching process or a wet etching process using hydrofluoric acid.

After the step of removing the insulating film IF1, the resist pattern PR1 is removed by an asking process or others.

Then, by a thermal process to the semiconductor substrate SB, the impurities contained in the channel region CH1$a$ are activated. This thermal process for the activation is performed under a condition, for example, at 950° C. for about 1 minute. A nitrogen concentration of the nitrogen-introduction portion NL is about $1 \times 10^{20}$ to $2 \times 10^{20}/cm^3$.

In the above-described manner, the channel region CH1a and the nitrogen-introduction portion NL are formed in the well PW in the region 1Aa. Although explained in detail later, this nitrogen-introduction portion NL is formed for improving a retention property of the memory transistor MTr.

In the present embodiment, also in the step of removing a part of the insulating film IF1 in FIG. 8, the resist pattern PR1 used in the step of forming the channel region CH1a and the nitrogen-introduction portion NL in FIG. 7 is used. Therefore, it is not required to prepare a new mask, so that a manufacturing cost can be reduced.

Figure 9:
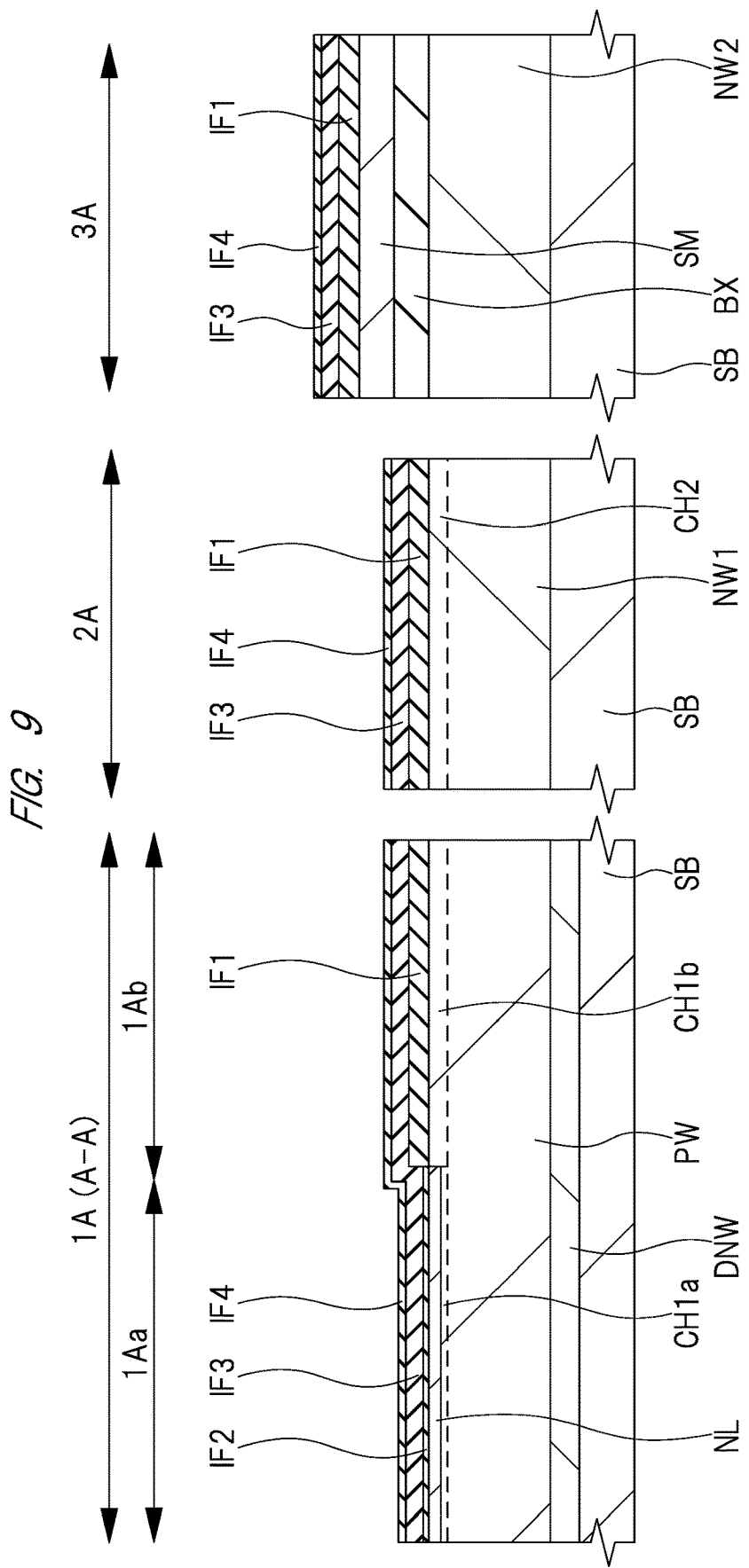
FIG. 9 is a cross-sectional view showing a manufacturing step of the semiconductor device, continued from FIG. 8.

FIG. 9 shows a step of forming an insulating film "IF2", an insulating film "IF3" and an insulating film "IF4".

First, on the well PW in the region 1Aa, the insulating film IF2 made of, for example, silicon oxide is formed by using, for example, a thermal oxidation method. A thickness of the insulating film IF2 is about 2 to 3 nm. At this stage, note that a thickness of each insulating film IF1 slightly increases since the insulating films IF1 in the regions 2A and 3A are also subjected to the thermal oxidation process. In the step of forming the insulating films IF2, a part of nitrogen of the nitrogen-introduction portion NL is taken into the insulating films IF2 in the region 1Aa.

Next, for example, by a CVD method or an ALD method, the insulating films IF3 made of, for example, silicon nitride is formed on the insulating film IF2 in the region 1Aa. At this stage, in the regions 1Ab, 2A and 3A, the insulating film IF3 is formed on the insulating film IF1. A thickness of the insulating film IF3 is about 5 to 10 nm. The insulating film IF3 is a film to be the charge storage layer CSL that is a part of the gate insulating film GF1a of the memory transistor MTr in a later step, which is a trap insulating film that can store the charges.

Next, for example, by an ISSG (In-situ Steam Generation) oxidation method, the insulating films IF4 made of, for example, silicon oxide is formed on the insulating films IF3 in the regions 1A to 3A. Note that a thickness of each insulating film IF4 is about 3 to 4 nm. The insulating film IF4 may be formed by a CVD method instead of the ISSG oxidation method.

Figure 10:
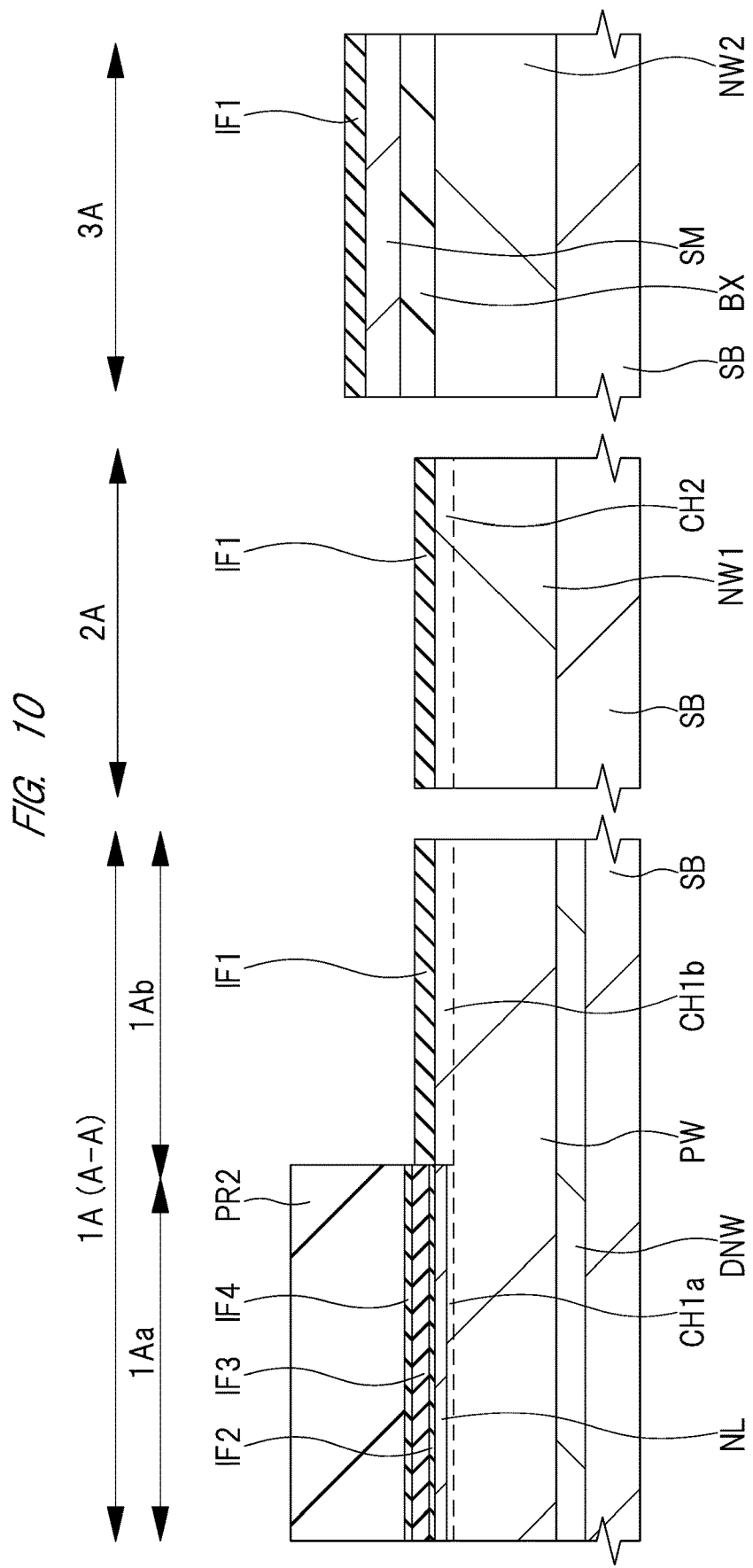
FIG. 10 is a cross-sectional view showing a manufacturing step of the semiconductor device, continued from FIG. 9.

FIG. 10 shows a step of removing the insulating film IF3 and the insulating film IF4.

First, a resist pattern PR2 covering the region 1Aa and exposing the regions 1Ab, 2A and 3A is formed. Next, by an etching process using the resist pattern PR2 as a mask, the insulating film IF4 and the insulating film IF3 exposed from the resist pattern PR2 are sequentially removed. In this manner, the insulating film IF4 and the insulating film IF3 remain in the region 1Aa, and the insulating film IF1 is exposed in other regions. Then, the resist pattern PR2 is removed by an ashing process or others.

Figure 11:
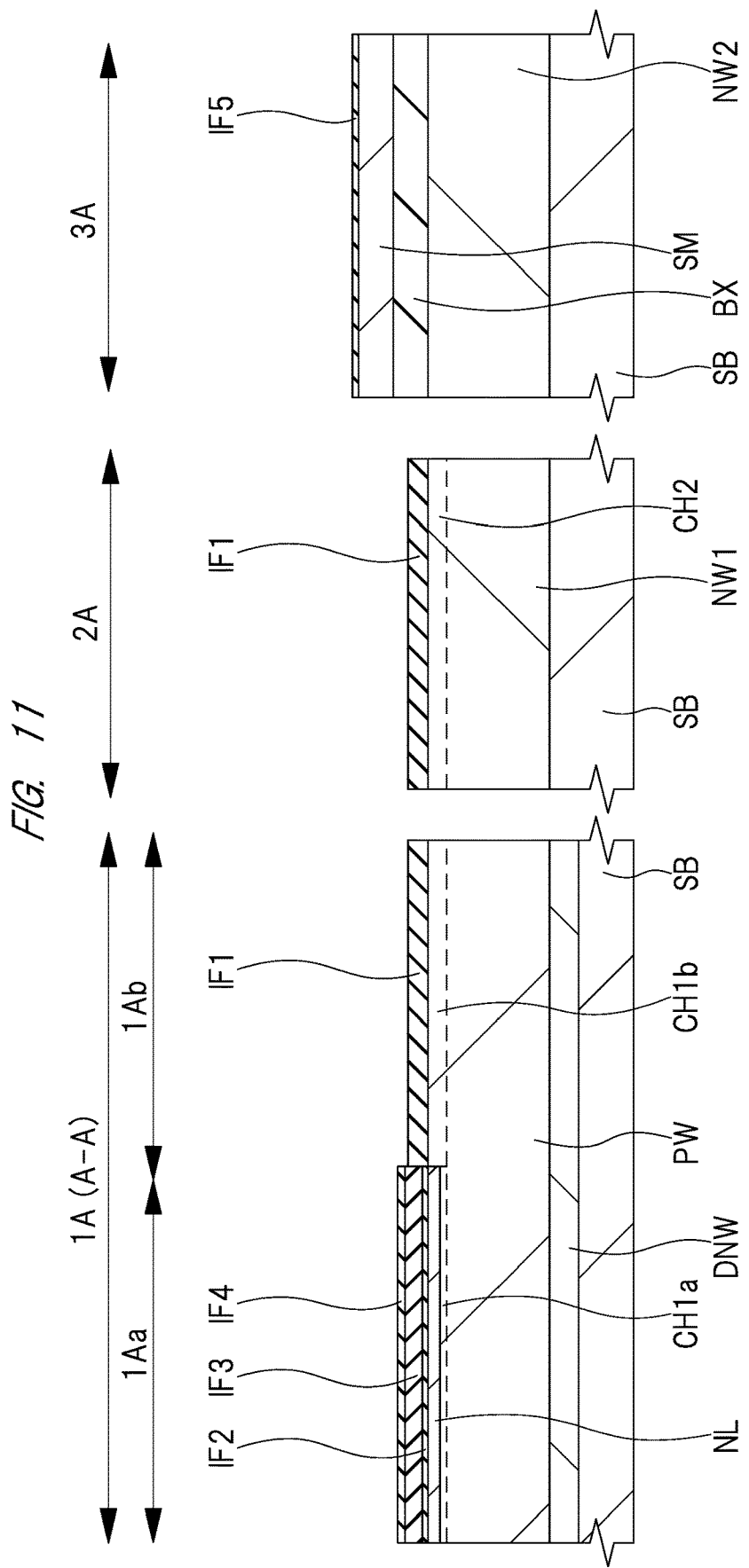
FIG. 11 is a cross-sectional view showing a manufacturing step of the semiconductor device, continued from FIG. 10.

FIG. 11 shows a step of removing the insulating film IF1 and a step of forming an insulating film IF5.

First, a resist pattern (not illustrated) covering the regions 1A and 2A and exposing the region 3A is formed. Next, by a wet etching process using this resist pattern as a mask and using hydrofluoric acid or others, the insulating film IF1 is removed in the region 3A to expose the semiconductor layer SM. Then, this resist pattern is removed by an ashing process or others.

Next, by an ISSG oxidation method, the insulating film IF5 made of, for example, silicon oxide is formed on the semiconductor layer SM in the region 3A. This insulating film IF5 becomes a gate insulating film GF3 of the MISFET 2Q in a later step. A thickness of the insulating film IF5 is about 2 to 3 nm. At this stage, note that the thicknesses of the insulating film IF4 formed in the region 1Aa and the insulating films IF1 formed in the regions 1Ab and 2A slightly increase since these insulating films are also subjected to the thermal oxidation process.

Figure 12:
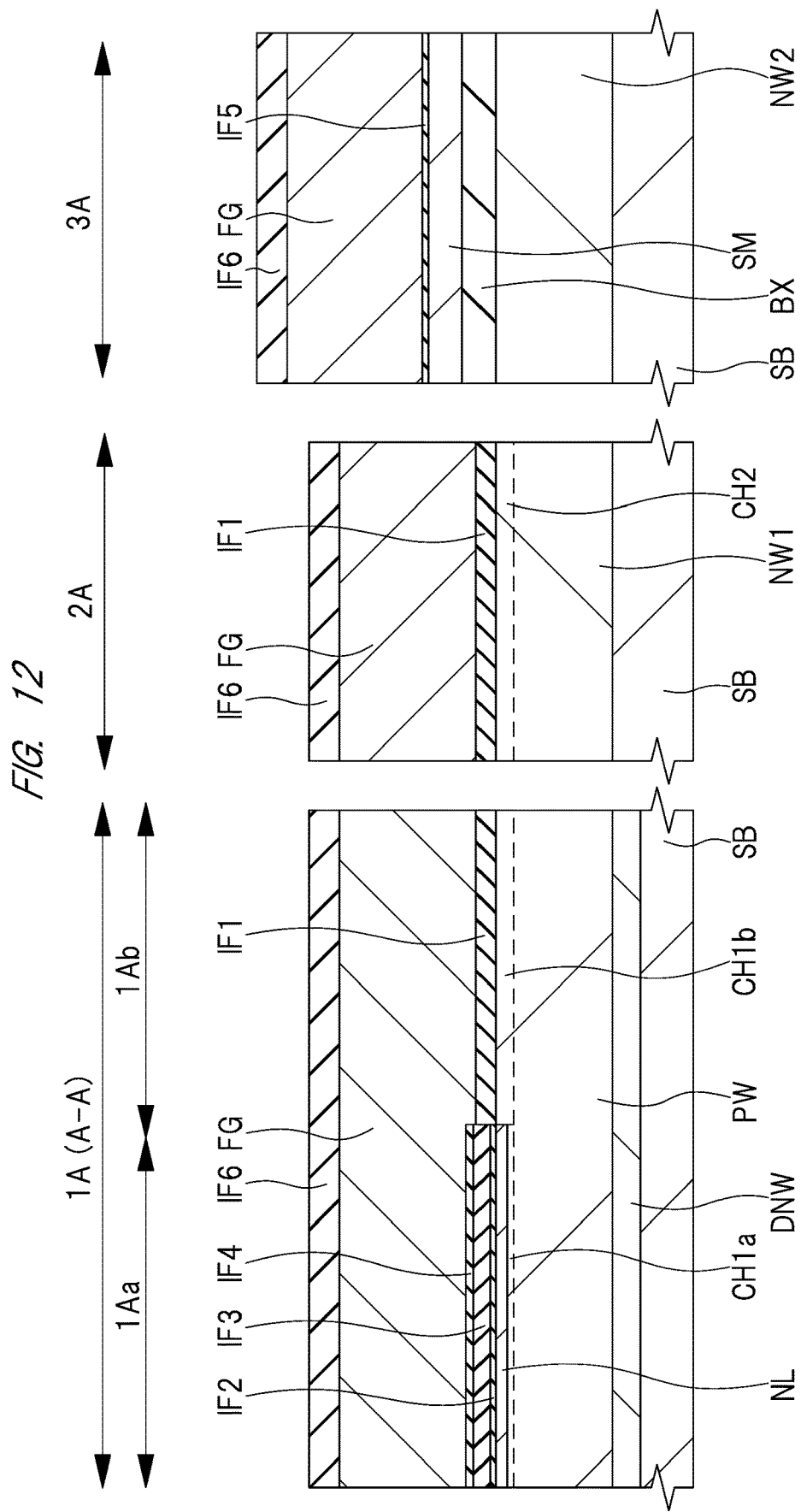
FIG. 12 is a cross-sectional view showing a manufacturing step of the semiconductor device, continued from FIG. 11.

FIG. 12 shows a step of forming a conductive film "FG" and an insulating film IF6.

First, the conductive film FG made of, for example, poly crystal silicon is deposited so as to cover the regions 1A to 3A by, for example, a CVD method. Subsequently, by using a photolithography method and an ion implantation method, impurities are introduced into the conductive film FG in each region. At this stage, an n-type impurity is introduced into the conductive film FG in the region 1A, and a p-type impurity is introduced into the conductive films FG in the regions 2A and 3A. Note that the conductive film FG is not limited to the poly crystal silicon film, and may be a metal film or a stacked film of a poly crystal silicon film and a metal film.

Next, the insulating film IF6 made of, for example, silicon oxide is deposited on the conductive film FG by, for example, a CVD method.

Figure 13:
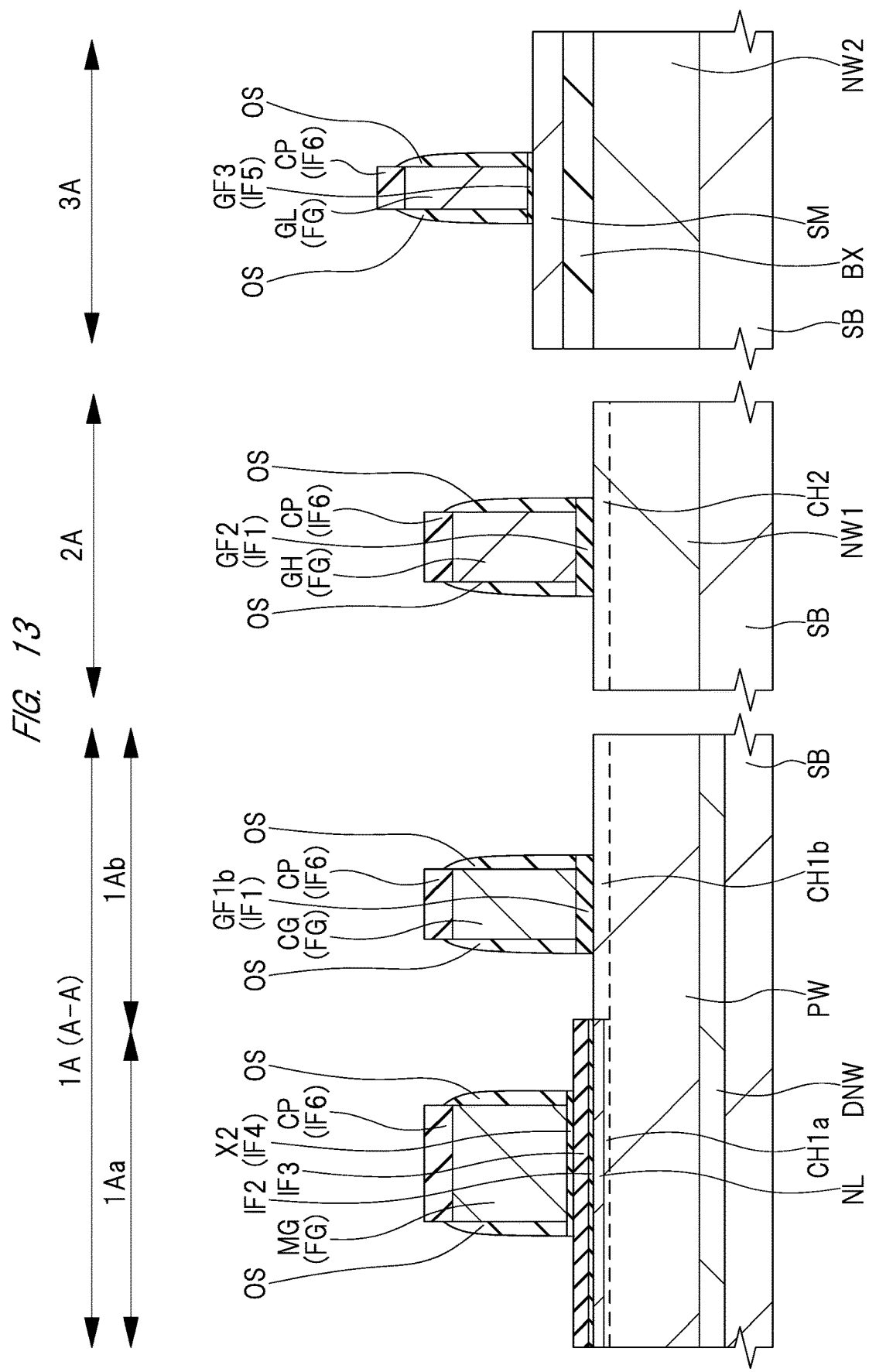
FIG. 13 is a cross-sectional view showing a manufacturing step of the semiconductor device, continued from FIG. 12.

FIG. 13 shows a step of forming a cap film "CP", a memory gate electrode "MG", a control gate electrode "CG", a gate electrode "GH", a gate electrode "GL", an offset spacer "OS", an insulating film "X2", a gate insulating film "GF1b", a gate insulating film "GF2" and a gate insulating film "GF3".

First, by using a photolithography method and a dry etching method, the insulating film IF6 and the conductive film FG are patterned. Since the conductive film FG is patterned, the memory gate electrode MG is formed in the region 1Aa, the control gate electrode CG is formed in the region 1Ab, the gate electrode GH is formed in the region 2A, and the gate electrode GL is formed in the region 3A. Since the insulating film IF6 is patterned, each cap film CP is formed on each gate electrode.

Next, an insulating film made of, for example, silicon oxide is formed so as to cover the regions 1A to 3A by, for example, a CVD method. Subsequently, by anisotropic etching to this insulating film, the offset spacer OS is formed in each side surface of the memory gate electrode MG, the control gate electrode CG, the gate electrode GH and the gate electrode GL. At this stage, when the anisotropic etching is continued, the insulating film IF4, the insulating film IF1 and the insulating film IF5 exposed from the offset spacer OS are removed. As a result, the insulating film IF4 under the memory gate electrode MG in the region 1Aa remains as the insulating film X2, the insulating film IF1 under the control gate electrode CG in the region 1Ab remains as the gate insulating film GF1b, the insulating film IF1 under the gate electrode GH in the region 2A remains as the gate insulating film GF2, and the insulating film IF5 under the gate electrode GL in the region 3A remains as the gate insulating film GF3.

Figure 14:
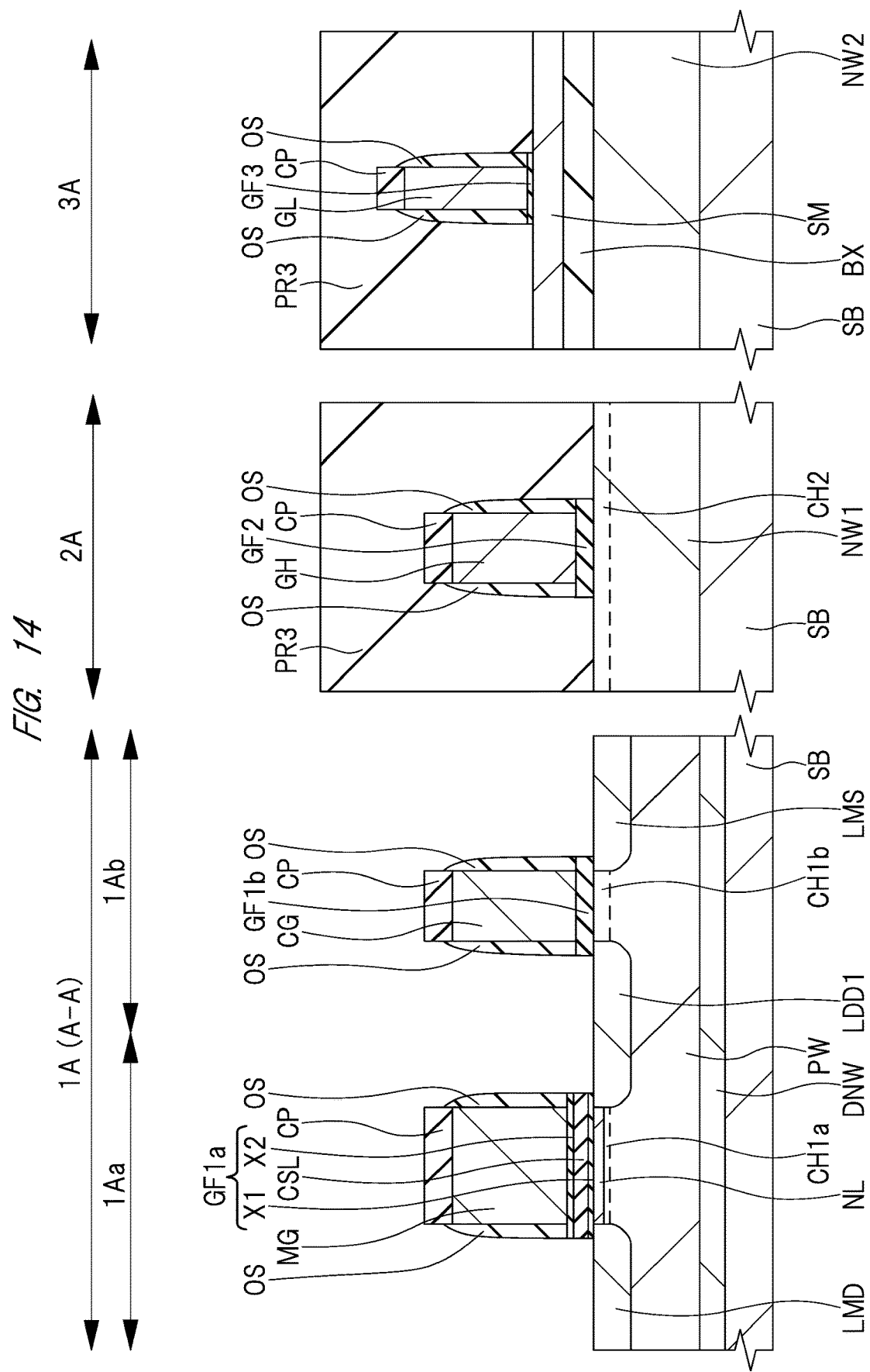
FIG. 14 is a cross-sectional view showing a manufacturing step of the semiconductor device, continued from FIG. 13.

FIG. 14 shows a step of forming the charge storage film CSL, the insulating film X1, an impurity region "LMS", an impurity region "LDD1" and an impurity region "LMD".

First, a resist pattern PR3 covering the regions 2A and 3A and exposing the region 1A is formed. Next, by an etching process using this resist pattern PR3 as a mask, the insulating films IF3 and IF2 exposed from the memory gate electrode MG and the offset spacer OS in the region 1Aa are sequentially removed by dry etching. As a result, under the memory gate electrode MG, the insulating film IF3 remains as the charge storage layer CSL, and the insulating film IF2 remains as the insulating film X1. In the above-described manner, under the memory gate electrode MG, a gate insulating film GF1a having the insulating film X2, the charge storage film CSL and the insulating film X1 is formed.

Next, by ion implantation of arsenic, phosphorous or others using this resist pattern PR3 as a mask, the n-type impurity region LMS, the n-type impurity region LDD1 and the n-type impurity region LMD are formed inside the well PW in the region 1A.

The impurity region LMS forms a part of a source region of the memory cell MC, and is formed in the semiconductor substrate SB on one side of the control gate electrode CG. The impurity region LDD1 becomes a region that electrically connects the selection transistor STr and the memory transistor MTr, and is formed in the semiconductor substrate SB in a part between the other side of the control gate electrode CG and one side of the memory gate electrode MG. The impurity region LMD forms a part of a drain region of the memory cell MC, and is formed in the semiconductor substrate SB on the other side of the memory gate electrode MG.

Then, the resist pattern PR3 is removed by an asking process or others.

The step of forming the impurity region LMS, the impurity region LDD1 and the impurity region LMD can be performed at the same timing as that of a step of forming an impurity region LDD2 performed later. However, when the resist pattern PR3 used in the step of removing the insulating films IF3 and IF2 is also used as shown in FIG. 14, it is not required to prepare a new mask, and a manufacturing cost can be reduced.

Figure 15:
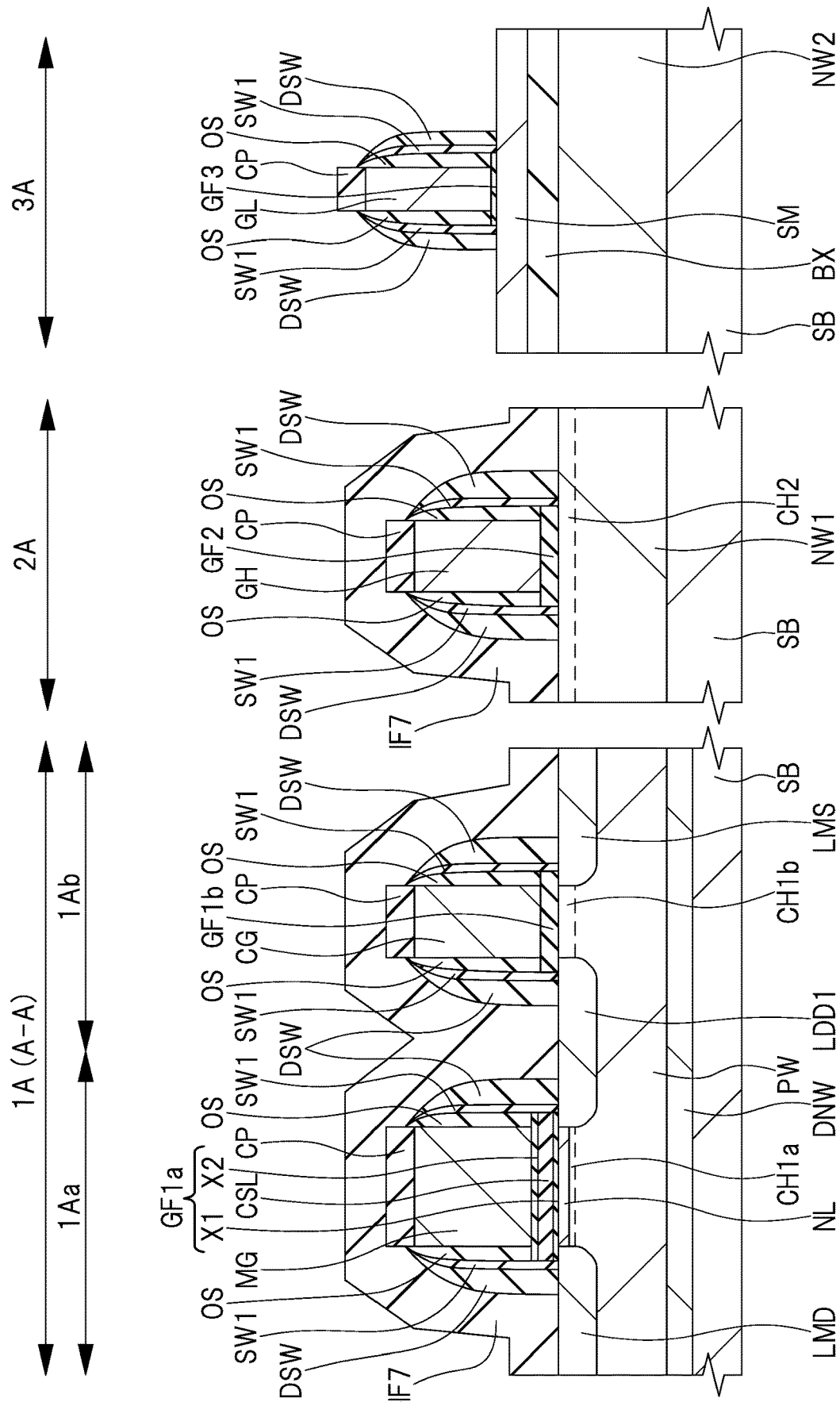
FIG. 15 is a cross-sectional view showing a manufacturing step of the semiconductor device, continued from FIG. 14.

FIG. 15 shows a step of forming a sidewall spacer SW1, a dummy sidewall spacer DSW and an insulating film IF7.

First, an insulating film made of, for example, silicon nitride is formed so as to cover the regions 1A to 3A by, for example, a CVD method. Next, by processing using anisotropic etching to this insulating film, the sidewall spacer SW1 is formed in each side surface of the memory gate electrode MG, the control gate electrode CG, the gate electrode GH and the gate electrode GL through the offset spacer OS. And, the sidewall spacer SW1 is formed also in each side surface of the gate insulating film GF1a, the gate insulating film GF1b, the gate insulating film GF2 and the gate insulating film GF3.

Next, an insulating film made of, for example, silicon oxide is formed so as to cover the regions 1A to 3A by, for example, a CVD method. Next, by processing using anisotropic etching to this insulating film, the dummy sidewall spacer DSW is formed in each side surface of the memory gate electrode MG, the control gate electrode CG, the gate electrode GH and the gate electrode GL through the sidewall spacer SW1 and the offset spacer OS.

Next, an insulating film IF7 made of, for example, silicon nitride is formed so as to cover the regions 1A to 3A by, for example, a CVD method. Next, by a photolithography method and an etching process, the insulating film IF7 in the region 3A is removed so that the insulating films IF7 in the regions 1A and 2A remain.

Figure 16:
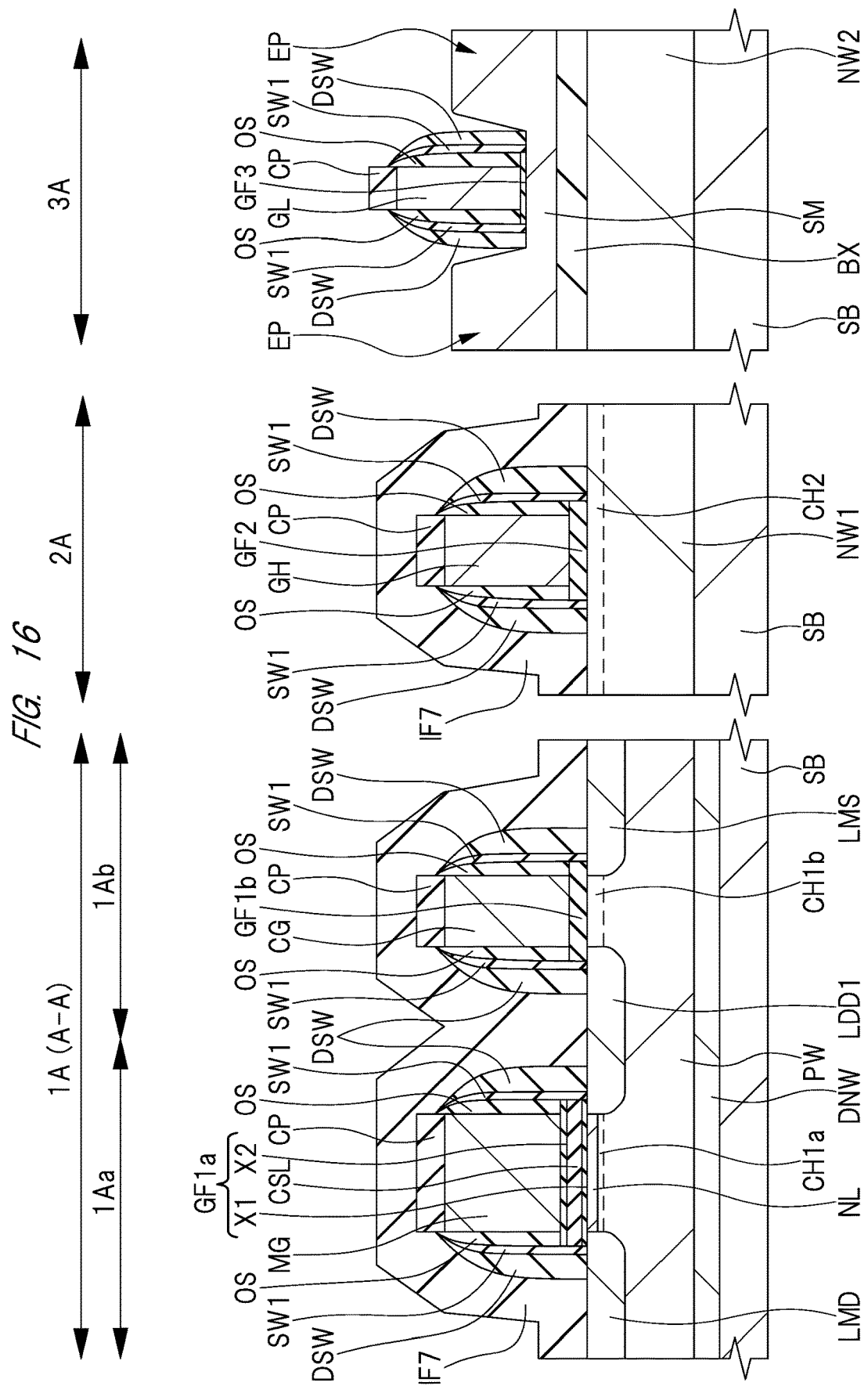
FIG. 16 is a cross-sectional view showing a manufacturing step of the semiconductor device, continued from FIG. 15.

FIG. 16 shows a step of forming an epitaxial layer EP.

The epitaxial layer EP (semiconductor layer EP) made of, for example, single crystal silicon is formed on the semiconductor layer SM in the region 3A by epitaxial growth while the regions 1A and 2A are covered by the insulating film IF7. A thickness of the semiconductor layer EP is about 20 to 40 nm. At this stage, since the gate electrode GL in the region 3A is covered by the cap film CP, the epitaxial layer EP is not formed on the gate electrode GL. Since the regions 1A and 2A are covered by the insulating film IF7, the epitaxial layer EP is not formed thereon.

It is desirable to perform this epitaxial growth in a state in which impurities have not been introduced into the semiconductor layer SM by ion implantation or others. For example, it is desirable to perform this epitaxial growth before an extension region "EX" described later is formed. A reason why it is desirable is that, when the epitaxial layer EP is formed on the semiconductor layer SM that has been damaged by an ion implantation method, crystalline nature of silicon forming the semiconductor layer SM is varied by the damage, and therefore, the epitaxial layer EP cannot be favorably grown. This result causes a risk of failing to form the epitaxial layer EP with desirable thickness and shape. Therefore, in the semiconductor device according to the present embodiment, the formation of the epitaxial layer EP is performed before the formation of the extension region EX.

The epitaxial layer EP is made of the same material as that of the semiconductor layer SM, and therefore, is monolithically formed therewith. The epitaxial layer EP is shown by an arrow in the drawings since it is difficult to understand the illustration of the epitaxial layer EP when a diffusion region "D3" is formed inside the epitaxial layer EP and inside the semiconductor layer SM in a later step.

Figure 17:
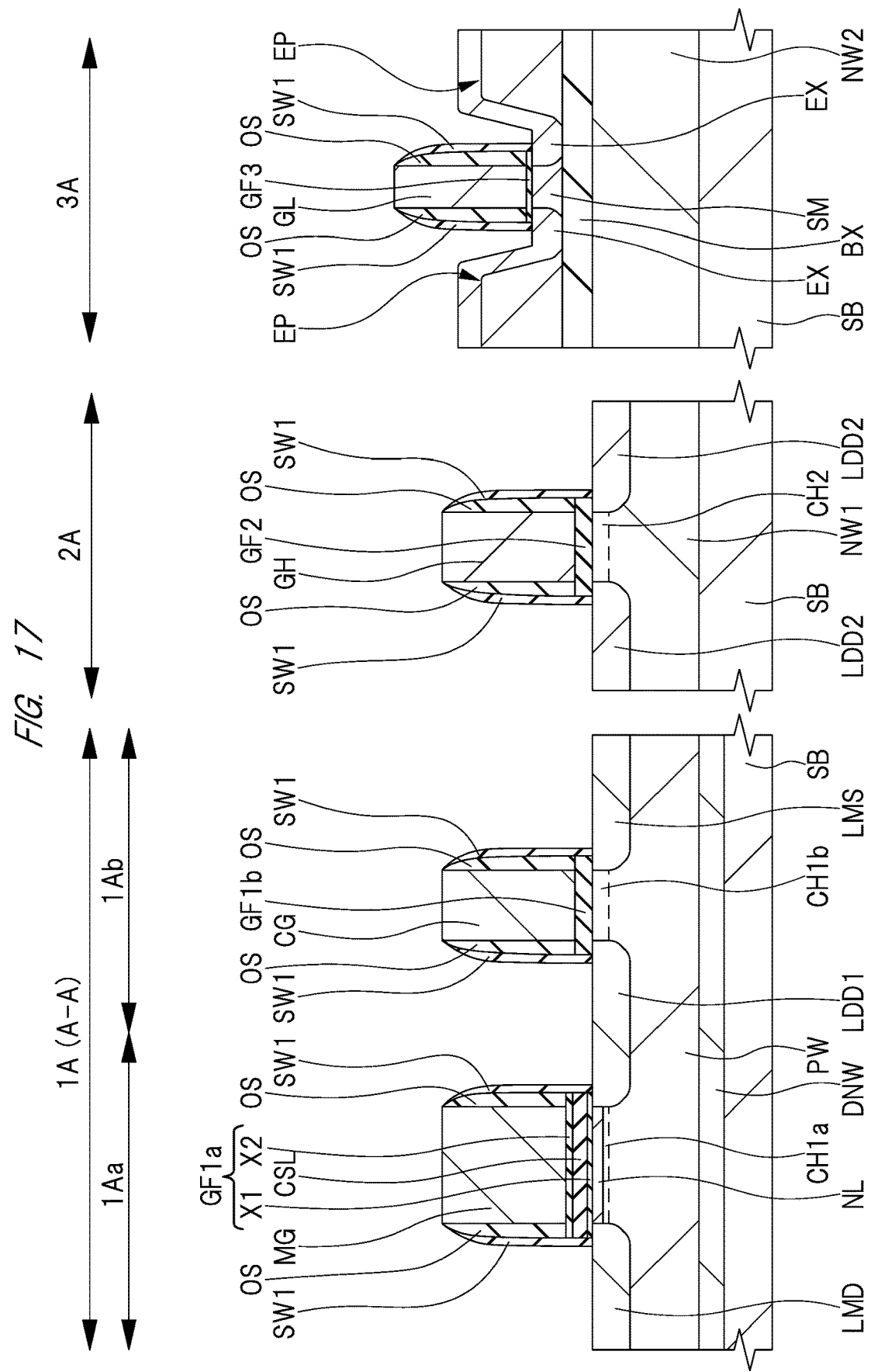
FIG. 17 is a cross-sectional view showing a manufacturing step of the semiconductor device, continued from FIG. 16.

FIG. 17 shows a step of removing the insulating film IF7, the dummy sidewall spacer DSW and the cap film CAP and a step of forming the impurity region LDD2 and the extension region EX.

First, by a wet etching process using solution containing phosphoric acid, the insulating film IF7 is removed. Next, by a wet etching process using solution containing hydrofluoric acid, the dummy sidewall spacer DSW is removed. At this stage, the cap film CAP made of silicon oxide that is the same as that of the dummy sidewall spacer DSW is also removed.

Next, by using a photolithography method and an ion implantation method, an impurity region is formed in each of the regions 2A and 3A.

In the region 2A, two p-type impurity regions LDD2 are formed. Each of the impurity regions LDD2 becomes apart of a source region of the MISFET $1Q$ or a part of a drain region of the MISFET $1Q$, and is formed in the semiconductor substrate SB on each of both sides of the gate electrode GH.

In the region 3A, two p-type extension regions (impurity regions) EX are formed. Each of the extension regions EX becomes a part of a source region of the MISFET $2Q$ or a part of a drain region of the MISFET $2Q$, and is formed in the semiconductor layer SM and the epitaxial layer EP on each of both sides of the gate electrode GL.

Figure 18:
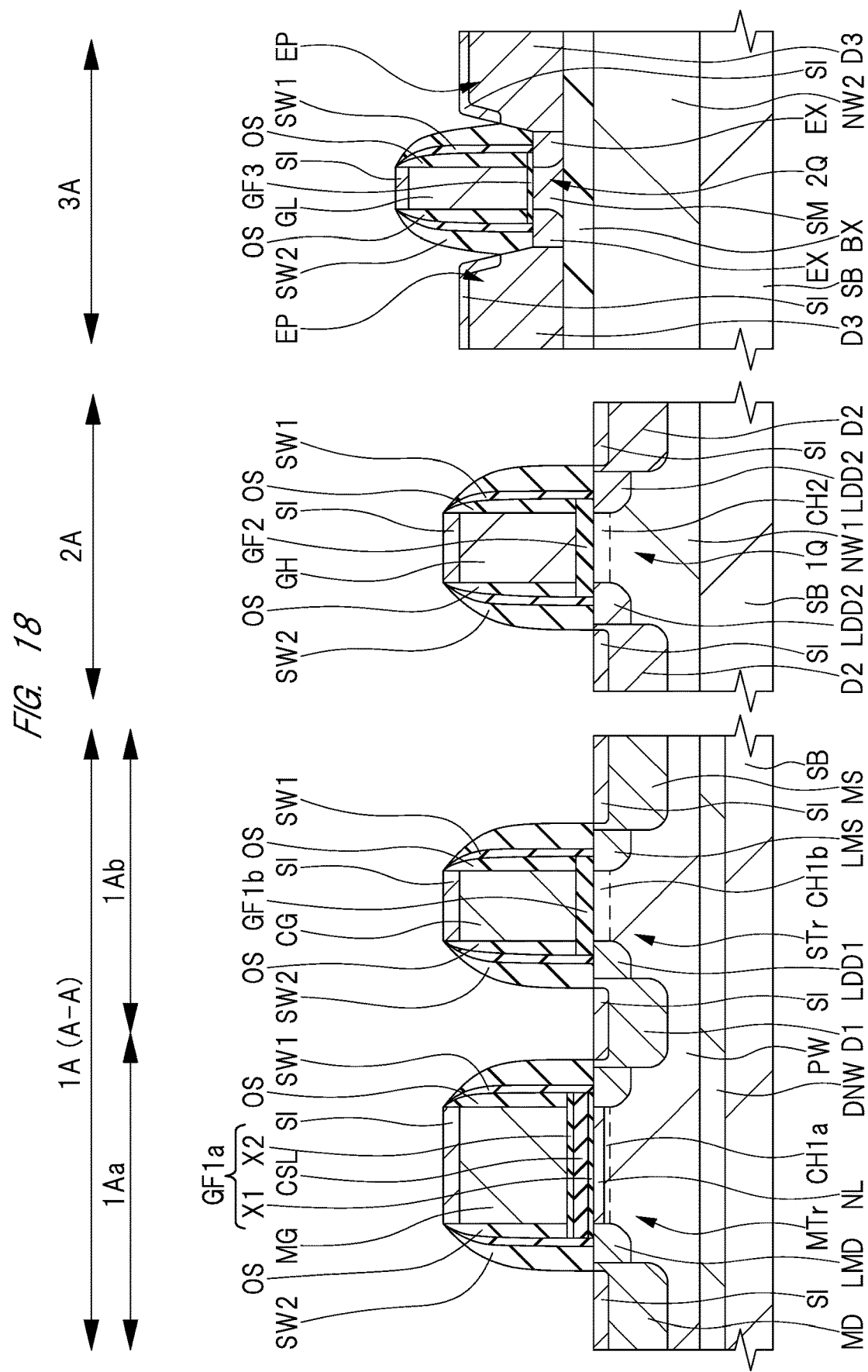
FIG. 18 is a cross-sectional view showing a manufacturing step of the semiconductor device, continued from FIG. 17.

FIG. 18 shows a step of forming a sidewall spacer "SW2", a diffusion region "MS", a diffusion region "MD", diffusion regions "D1" to "D3" and a silicide layer "SI".

First, an insulating film made of, for example, silicon oxide is formed so as to cover the regions 1A to 3A by, for example, a CVD method. Subsequently, by anisotropic etching to this insulating film, the sidewall spacer SW2 is formed in each side surface of the memory gate electrode MG, the control gate electrode CG, the gate electrode GH and the gate electrode GL through the offset spacer OS and the sidewall spacer SW1.

Next, by using a photolithography method and an ion implantation method, the n-type diffusion regions MS, D1 and MD are formed in the region 1A, the p-type diffusion region D2 is formed in the region 2A, and the p-type diffusion region D3 is formed in the region 3A.

In the region 1A, the n-type diffusion regions MS, D1 and MD are exposed from the sidewall spacer SW2, are formed in the semiconductor substrate SB where the impurity regions LMS, LDD1 and LMD are formed, and have higher impurity concentrations than those of the impurity regions LMS, LDD1 and LMD, respectively. The diffusion region MS is connected to the impurity region LMS, and becomes a part of the source region of the memory cell MC. The diffusion region MD is connected to the impurity region LMD, and becomes a part of the drain region of the memory cell MC.

In the region 2A, each of the p-type diffusion regions D2 is exposed from the sidewall spacer SW2, is formed in the semiconductor substrate SB where the impurity region LDD2 is formed, and has a higher impurity concentration than that of the impurity region LDD2. The diffusion region D2 is connected to the impurity region LDD2, and becomes a part of the source region of the MISFET 1Q or a part of the drain region of the MISFET 1Q.

In the region 3A, each of the p-type diffusion regions D3 is formed in the epitaxial layer EP and the semiconductor layer SM exposed from the sidewall spacer SW2, and has a higher impurity concentration than that of the extension region EX. The diffusion region D3 is connected to the extension region EX, and becomes a part of the source region of the MISFET 2Q or a part of the drain region of the MISFET 2Q.

Then, by a thermal process to the semiconductor substrate SB, each of the above-described impurity regions is diffused and activated.

Next, by a Salicide (Self Aligned Silicide) technique, the low-resistance silicide layer SI is formed on each upper surface of the diffusion region MS, the diffusion region MD, the diffusion regions D1 to D3, the memory gate electrode MG, the control gate electrode CG, the gate electrode GH and the gate electrode GL.

The silicide layer SI can be formed specifically as follows. First, a metal film for forming the silicide layer SI is formed so as to cover the regions 1A to 3A. This metal film is made of, for example, cobalt, nickel or nickel-platinum alloy. Next, by a thermal process to the semiconductor substrate SB, reactions between the metal film and the diffusion regions MD, MS and D1 to D3, the memory gate electrode MG, the control gate electrode CG, the gate electrode GH and the gate electrode GL are performed. In this manner, the silicide layer SI is formed on each upper surface of the diffusion regions MS, MD and D1 to D3, the memory gate electrode MG, the control gate electrode CG, the gate electrode GH and the gate electrode GL. Then, an unreacted metal film is removed. Because of the formation of the silicide layer SI, diffusion resistance and contact resistance can be reduced in the diffusion regions MS, MD and D1 to D3, the memory gate electrode MG, the control gate electrode CG, the gate electrode GH and the gate electrode GL.

As described above, the memory transistor MTr is formed in the region 1Aa, the selection transistor STr is formed in the region 1Ab, the MISFET 1Q is formed in the region 2A, and the MISFET 2Q is formed in the region 3A.

FIG. 19 shows a step of forming an interlayer insulating film "IL1", a plug "PG", an interlayer insulating film "IL2" and a wiring "M1".

First, in the regions 1A to 3A, the interlayer insulating film IL1 is formed so as to cover the memory transistor MTr, the selection transistor STr, the MISFET 1Q and the MISFET 2Q. As the interlayer insulating film IL1, a single film of a silicon oxide film, a stacked film obtained by forming a thick silicon oxide film on a silicon nitride film, or others can be used. After the formation of the interlayer insulating film IL1, an upper surface of the interlayer insulating film IL1 can be polished by a CMP (Chemical Mechanical Polishing) method if needed.

Next, by using a photolithography method and a dry etching method or others, a plurality of contact holes are formed inside the interlayer insulating film IL1, and each contact hole is infilled with a conductive film containing tungsten (W) as a main body, so that the plurality of plugs PG are formed inside the interlayer insulating film IL1. The plugs PG formed in the regions 1A to 3A are connected to the diffusion regions MD, MS, D2 and D3 through the silicide layer SI, respectively.

Next, the interlayer insulating film IL2 is formed on the interlayer insulating film IL1 that has been infilled with the plugs PG. Then, after formation of a trench for a wiring in the interlayer insulating film IL2, the trench for the wiring is infilled with, for example, a conductive film containing copper as a main component, so that the wiring M1 connected to the plug PG is formed inside the interlayer insulating film IL2. A structure of this wiring M1 is so called Damascene wiring structure.

Then, by a Dual Damascene method or others, wirings in second and subsequent layers are formed. However, illustration and explanation for the wirings are omitted here. The structures of the wiring M1 and the wirings in upper layers than the wiring M1 are not limited to the damascene structure. Each of the wirings can be also formed by patterning the conductive film to generate, for example, a tungsten wiring or an aluminum wiring.

As described above, the semiconductor device according to the present embodiment is manufactured.

First to Third Study Examples

The first to third study examples that have been studied by the inventor of the present application will be explained below with reference to FIGS. 30 to 32. In these first to third study examples, nitrogen is introduced into the channel region CH1a of the memory transistor MTr as similar to the present embodiment. However, as different from the present embodiment, nitrogen is also introduced into each channel region or each gate insulating film of the selection transistor STr and the MISFETs 1Q and 2Q.

In the memory transistor MTr, an Si—H bond or others is cut at an interface between the semiconductor substrate SB and the insulating film X1 (insulating film IF2) by a stress due to repetition of the writing operation and the erasing operation, and an interface state (a dangling bond) is caused. Because of increase in the interface state, a problem of deterioration of a retention property of the memory transistor MTr arises. In order to solve such a problem, nitrogen is introduced into the interface between the semiconductor substrate SB and the insulating film X1 (insulating film IF2), so that the increase in the interface state can be suppressed.

In the first study example, as the step of introducing the nitrogen, a thermal process is performed in atmosphere containing nitrogen such as NO atmosphere. Hereinafter, this thermal process is called an NO process.

Figure 30:
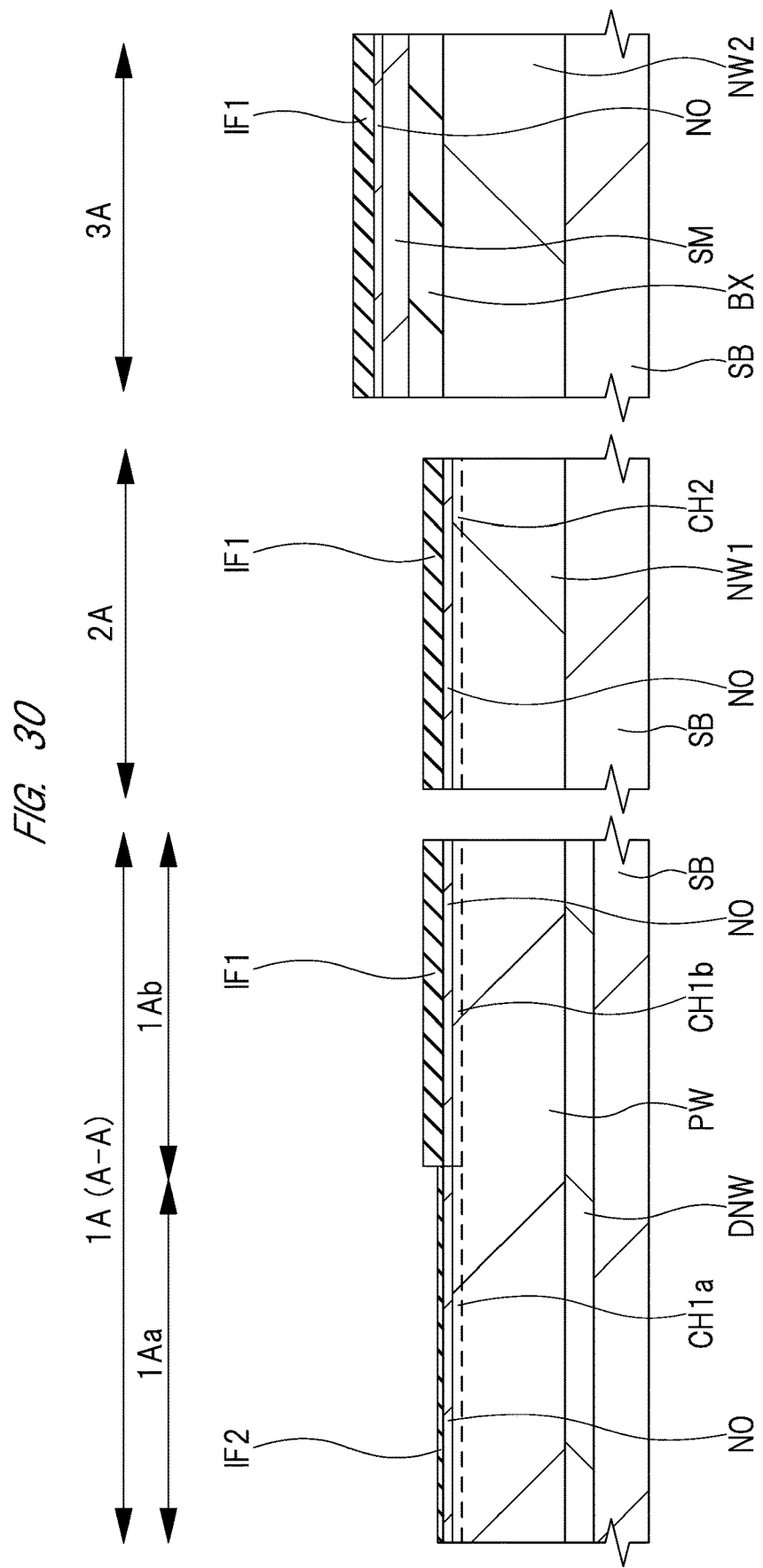
FIG. 30 is a cross-sectional view showing a manufacturing step of a semiconductor device according to a first study example.

FIG. 30 is a cross-sectional view showing a manufacturing step in the first study example, and shows a step immediately after the formation of the insulating film IF2 explained in FIG. 9 of the present embodiment. After the formation of the insulating film IF2, the NO process is performed. The NO process is performed under a condition at about 900° C. for about 30 seconds. In this manner, nitrogen is introduced into each of an interface between the semiconductor substrate SB and the insulating film IF2 in the region 1Aa, interfaces between the semiconductor substrate SB and the insulating film IF1 in the regions 1Ab and 2A, and an interface between the insulating film IF1 and the semiconductor layer SM in the region 3A. FIG. 30 shows a region to which the nitrogen has been introduced as the nitrogen-introduction portion NL.

Also by this NO process, the retention property of the memory transistor MTr can be improved.

However, since the NO process is performed to the entire semiconductor substrate SB, nitrogen is introduced into not only the gate insulating film of the memory transistor MTr in the region 1Aa but also the gate insulating films of the transistors in other regions (such as the regions 1Ab, 2A and 3A). Consequently, NBTI (Negative Bias Temperature Instability) has undesirably deteriorated in the p-type MISFETs such as the MISFET 1Q in the region 2A and the MISFET 2Q in the region 3A. That is, by the studies of the inventor of the present application, it has been found that a problem of reduction in the reliability of the transistor in each region is caused by the introduction of nitrogen.

In the second study example, as the step of introducing the nitrogen, nitrogen is introduced by ion implantation as similar to the present embodiment. However, as different from the present embodiment, the ion implantation is performed to the entire regions 1A to 3A.

Figure 31:
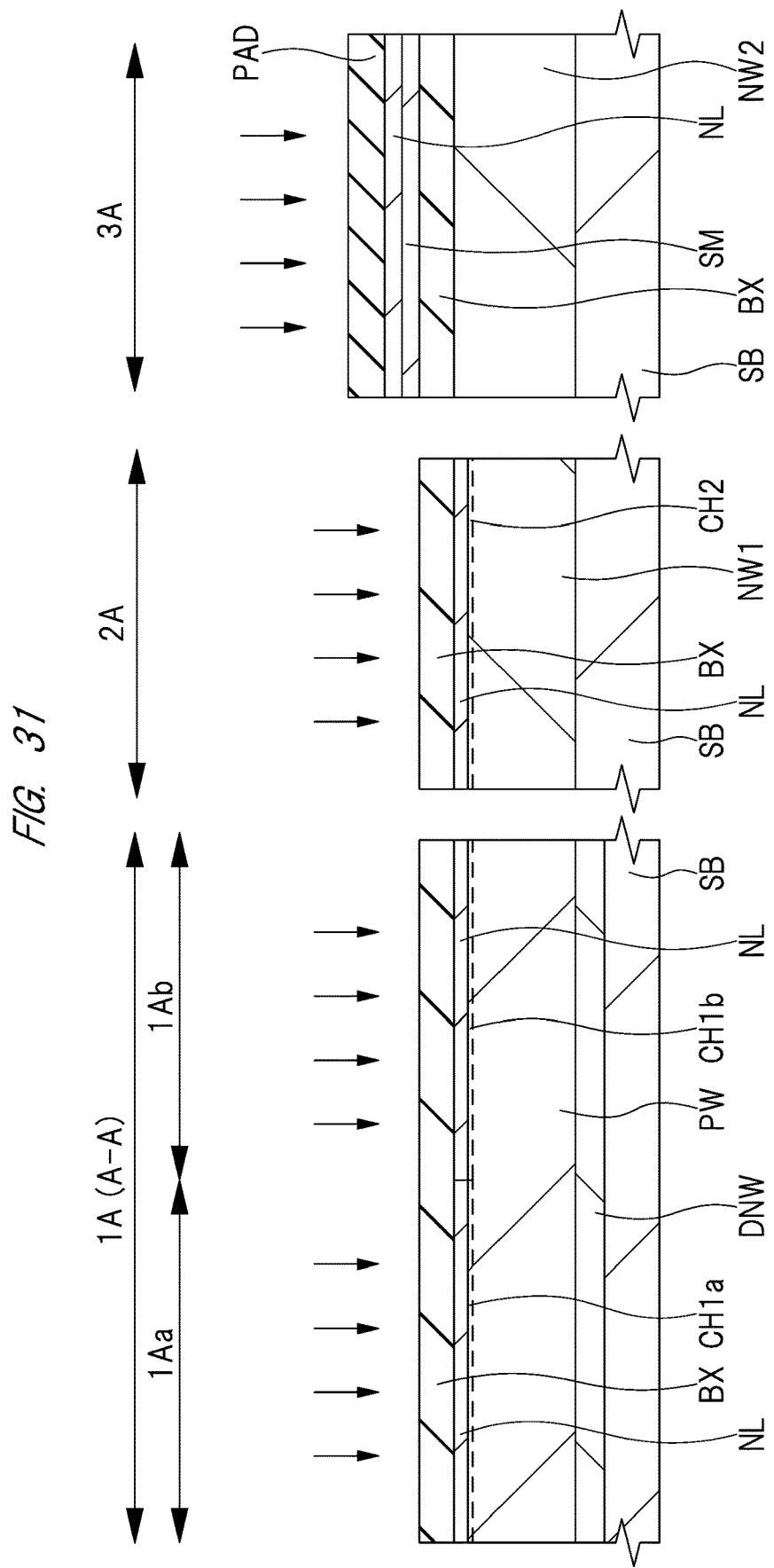
FIG. 31 is a cross-sectional view showing a manufacturing step of a semiconductor device according to a second study example.

FIG. 31 is a cross-sectional view showing a manufacturing step in the second study example, and shows a step continued from the step explained in FIG. 6 of the present embodiment. After ion implantation for forming the channel region CH1a in the region 1Aa, ion implantation using nitrogen is performed to the entire regions 1A to 3A. Note that a condition for this ion implantation is as the same as that of the present embodiment. In this manner, the nitrogen-introduction portion NL is formed in the surfaces of the semiconductor substrate SB in the regions 1A and 2A and a surface of the semiconductor layer SM in the region 3A.

Also by this nitrogen ion implantation, the retention property of the memory transistor MTr can be improved. As different from the NO process of the first study example, after the nitrogen ion implantation, the insulating layer BX is removed in the region 2A, and the insulating film PAD is removed in the region 3A. Then, the insulating layer IF1 is formed on the semiconductor substrate SB in the region 2A and on the semiconductor layer SM in the region 3A. When the insulating layer IF1 is formed, apart of the nitrogen in the nitrogen-introduction portion NL is taken into the insulating film IF1.

In a result of the studies made by the inventor of the present application, it has been found that the deterioration of the NBTI caused in the first study example is almost not caused in the second study example. However, in the second study example, it has been observed that TZDB (Time Zero Dielectric Breakdown) voltage deteriorates in an n-type high-breakdown-voltage MISFET (not illustrated) in the region 2A. It is considered that difference in such phenomenon is caused by difference in a peak of a nitrogen concentration in the insulating film IF1 due to difference in a timing of the nitrogen introduction.

As described above, also in the second study example, reliabilities of other transistors than the memory transistor MTr are reduced.

In the third study example, as the step of introducing the nitrogen, a nitrogen plasma process is performed.

Figure 32:
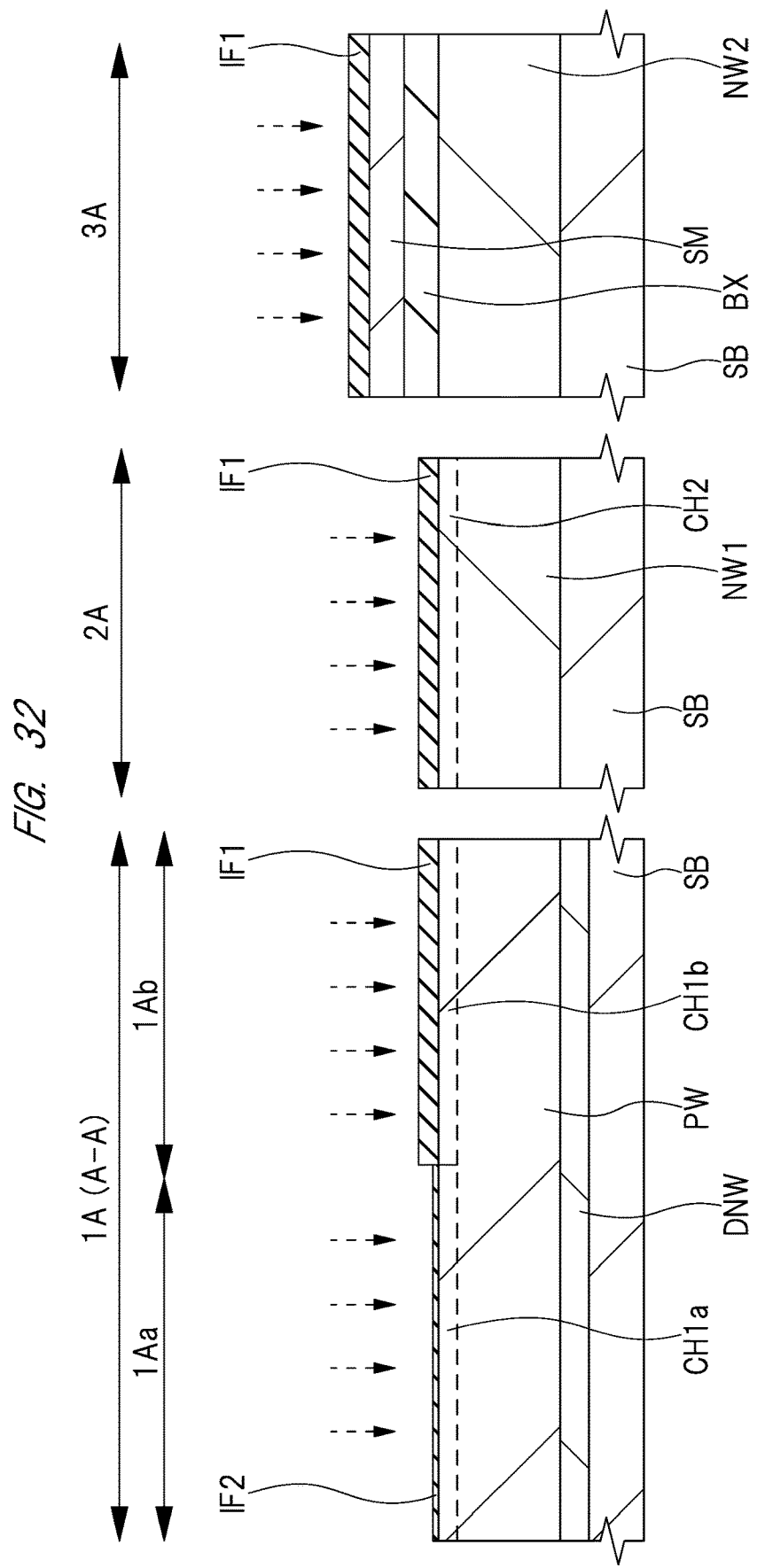
FIG. 32 is a cross-sectional view showing a manufacturing step of a semiconductor device according to a third study example.

FIG. 32 is a cross-sectional view showing a manufacturing step in the third study example, and shows a step immediately after the formation of the insulating film IF2 explained in FIG. 9 of the present embodiment. After the formation of the insulating film IF2, the nitrogen plasma process is performed. In this manner, a surface side of the insulating film IF2 is azotized, so that the nitrogen is introduced into the insulating film IF2.

However, by experiments made by the inventor of the present application, it has been found that this nitrogen plasma process deteriorates the retention property of the memory transistor MTr as different from the NO process and the nitrogen ion implantation.

As described above, in the first to third study examples, it has been found that it is difficult to achieve both the improvement of the retention property of the memory transistor MTr and the improvement of the reliabilities of other transistors.

Regarding Main Feature of Present Embodiment

In the present embodiment, by the nitrogen ion implantation explained in FIG. 8, in the region 1Aa, nitrogen is introduced into the surface of the channel region CH1a, so that the nitrogen-introduction portion NL is formed. In the regions 1Ab, 2A and 3A, the nitrogen ion implantation is not performed, so that the nitrogen-introduction portion NL is not formed.

Therefore, in the present embodiment, the retention property of the memory transistor MTr is improved, and the deterioration in the NBTI and the deterioration in the TZDB voltage are not caused as different from the first to third study examples. Therefore, both the improvement of the reliability of the memory transistor MTr and the improvement of the reliabilities of other transistors can be achieved. That is, the reliability of the semiconductor device can be improved.

Particularly, as explained in FIG. 3, at the time of the writing operation or the erasing operation in the memory cell MC of the present embodiment, the electrons are injected from the entire surface of the channel region CH1a under the memory gate electrode MG to the charge storage layer CSL or are withdrawn from the charge storage layer CSL to the entire surface of the channel region CH1a by the FN tunnel phenomenon. As described above, at the time of the writing operation or the erasing operation using the entire surface of the channel region CH1a, the introduction of nitrogen into only a part of the channel region CH1a such as vicinity of an end of the memory gate electrode MG has no effect, and the retention property of the memory transistor MTr is improved by the introduction of nitrogen into the entire surface of the channel region CH1a.

Figure 20:
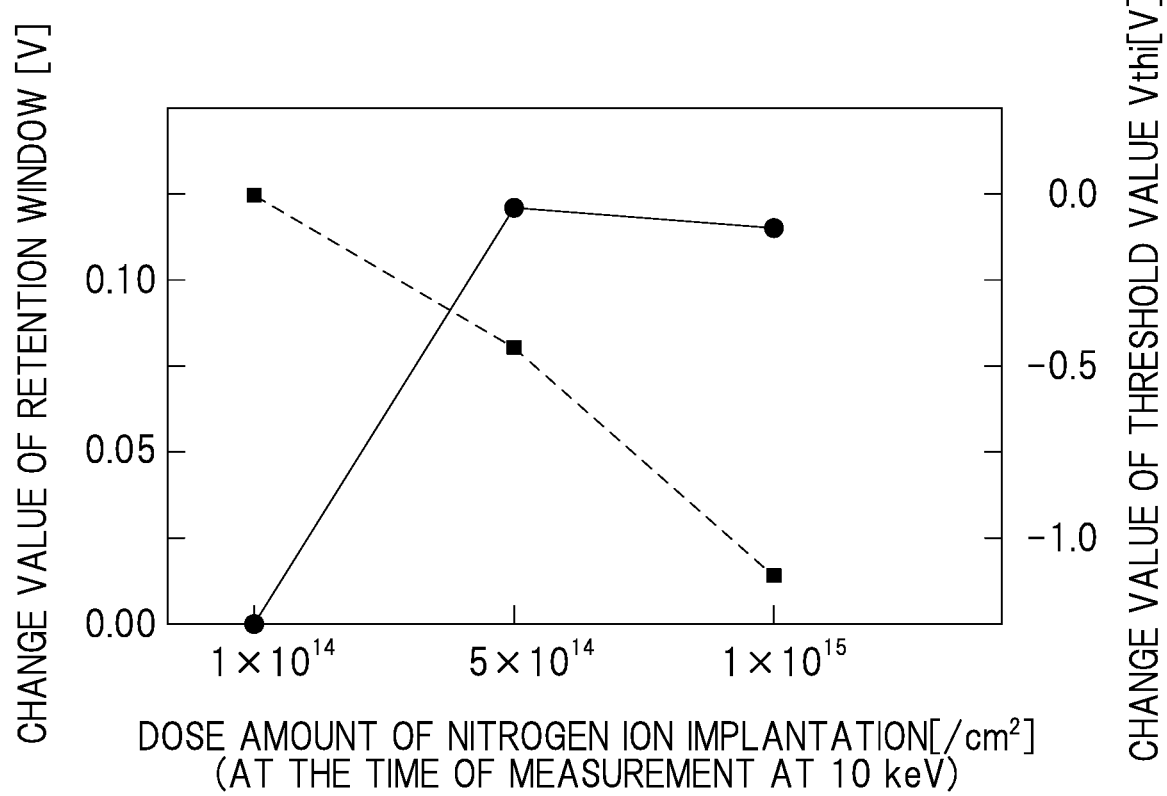
FIG. 20 is a diagram showing experimental data made by the inventor of the present application.
Figure 21:
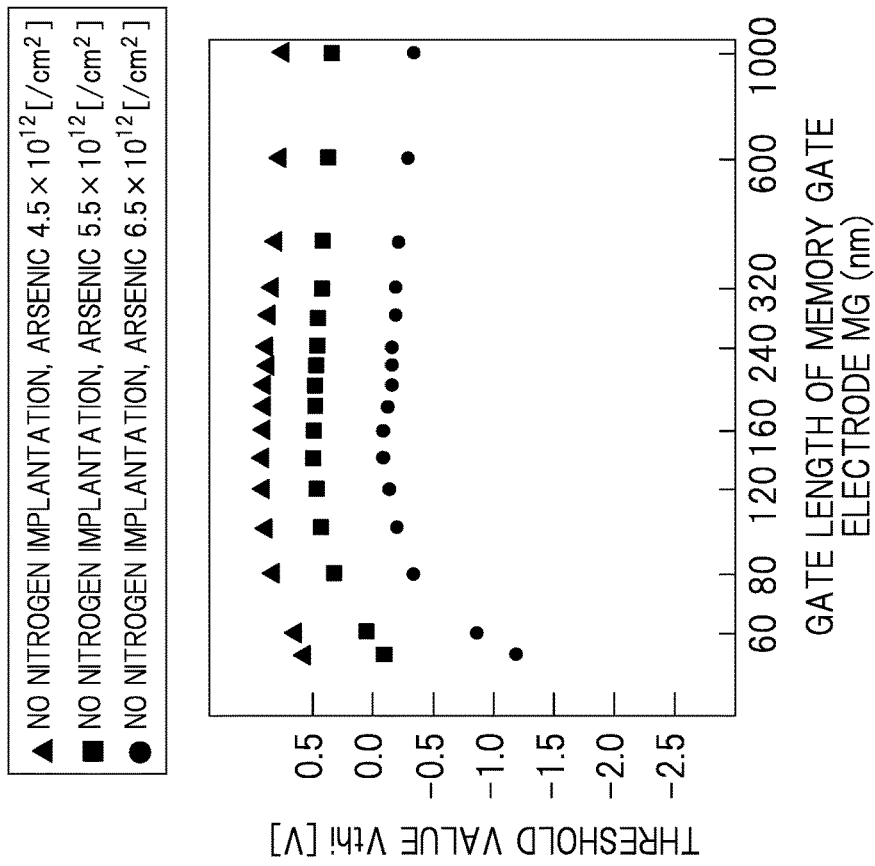
FIG. 21 is a diagram showing experimental data made by the inventor of the present application.

With reference to FIGS. 20 and 21, the improvement of the retention property of the memory transistor MTr according to the present embodiment and other effects will be explained below.

FIG. 20 is a diagram showing experimental data made by the inventor of the present application, and shows a relation among a dose amount of the nitrogen ion implantation at the time of the manufacturing step of FIG. 8, a change value (solid line) of a retention window of the memory transistor MTr, and a change value (broken line) of a threshold value "Vthi" of the memory transistor MTr. Note that FIG. 20 shows a case in which an implantation energy of the nitrogen ion is set to 10 keV.

When the nitrogen dose amount is $1\times10^{14}/cm^2$, the retention window did almost not change. On the other hand, when the nitrogen dose amount is in a range of $5\times10^{14}$ to $1\times10^{15}/\text{cm}^2$, significant improvement of the retention window was observed. Therefore, the nitrogen ion step is desirably performed under a condition of the implantation energy of 10 keV and the dose amount in the range of $5\times10^{14}$ to $1\times10^{15}/\text{cm}^2$. When the dose amount is too high, defects caused in the semiconductor substrate SB are too many, and it is easy to cause a leakage current inside the channel region CH1$a$. Therefore, the dose amount is desirable in the above-described range. When the implantation energy is 6 keV, a condition in a range from $1\times10^{14}$ to $5\times10^{14}/\text{cm}^2$ as the dose amount is desirable.

Regarding the change of the threshold value Vthi of the memory transistor MTr, it did almost not change when the nitrogen dose amount is $1\times10^{14}/\text{cm}^2$, and the change was observed when the nitrogen dose amount is in a range that is equal to or lower than $5\times10^{14}/\text{cm}^2$.

Generally, by ion implantation of the n-type impurity such as arsenic (As) to a surface of the p-type well PW, the channel region CH1$a$ is formed so as to adjust the threshold value Vthi of the memory transistor MTr. However, from the graph, it has been found that the threshold value Vthi of the memory transistor MTr can be adjusted also by the nitrogen ion implantation process disclosed in the present embodiment as described above.

FIG. 21 is a diagram showing experimental data made by the inventor of the present application, and shows a relation among a nitrogen dose amount at the time of the manufacturing step of FIG. 8, and a gate length of the memory gate electrode MG and the threshold value Vthi of the memory transistor MTr obtained when the arsenic dose amount changes.

First, with reference to a right graph of FIG. 21, it has been found that, when nitrogen is not introduced into the channel region CH1$a$, the threshold value Vthi of the memory transistor MTr can be reduced by increase in the arsenic dose amount.

Next, with reference to a left graph of FIG. 21, it has been found that, when the arsenic dose amount that is introduced into the channel region CH1$a$ is constant, the threshold value Vthi of the memory transistor MTr can be reduced by increase in the nitrogen dose amount.

These graphs show that, for example, a condition with the nitrogen dose amount of $5\times10^{14}/\text{cm}^2$ and the arsenic dose amount of $5.5\times10^{12}/\text{cm}^2$ almost corresponds to a condition without the nitrogen implantation and with the arsenic dose amount of $6.5\times10^{12}/\text{cm}^2$. That is, by the nitrogen introduction into the channel region CH1$a$, the arsenic dose amount can be reduced.

As described above, in order to reduce the threshold value Vthi of the memory transistor MTr, the method of the ion implantation using the n-type impurity such as arsenic (As) into the surface of the p-type well PW is generally used. In this case, in order to further reduce the threshold value Vthi, it is required to increase the arsenic dose amount. However, implantation of arsenic with a high concentration causes problems such as deterioration in a short channel property, reduction in mobility, and increase in variation of the threshold value Vthi of each memory transistor MTr in a semiconductor wafer plane. That is, in a related-art technique, it is difficult to sufficiently reduce the threshold value Vthi of the memory transistor MTr while the reliability of the semiconductor device is secured.

On the other hand, the threshold value Vthi of each memory transistor MTr can be reduced by the introduction of nitrogen into the channel region CH1$a$ as described in the present embodiment, and therefore, it is not required to perform the implantation of arsenic with the high concentration. Therefore, in the present embodiment, each of the above-described problems is not caused, and thus, the reliability of the semiconductor device can be improved.

For example, a condition in which the arsenic dose amount is $5.5\times10^{12}/\text{cm}^2$ is conventionally used. On the other hand, the present embodiment can be made under a condition in which the arsenic dose amount is equal to or lower than $3.0\times10^{12}/\text{cm}^2$.

In the present embodiment, also in the step of removing a part of the insulating film IF1 of FIG. 8, the resist pattern PR1 used in the step of forming the channel region CH1$a$ and the nitrogen-introduction portion NL of FIG. 7 is used. Therefore, it is not required to form a new mask, and the manufacturing cost can be reduced.

In the present embodiment, in order to suppress the increase in the manufacturing cost, each gate electrode in the regions 1A to 3A is made of the conductive film FG that is single layer. Regarding this, for example, in the Patent Document 1 described above in the "BACKGROUND OF THE INVENTION" section, a gate electrode of a non-volatile memory cell region and each gate electrode of other regions are formed by using separate conductive films from each other. Therefore, the number of the manufacturing steps increases, and the manufacturing cost increases. However, in each region, it is easy to select to which gate insulating film the nitrogen is to be introduced. For example, after nitrogen is introduced to the gate insulating film of the non-volatile memory cell region, the gate electrode in the non-volatile memory cell region can be formed, and then, the gate insulating film and the gate electrode in other region could can be formed.

On the other hand, since each gate electrode is made of the conductive film FG that is the single layer in the present embodiment, it is required to previously form the gate insulating film in each region. Therefore, in a technique of determining to which gate insulating film the nitrogen is to be selectively introduced, the present embodiment is more difficult than the Patent Document 1 and others. Thus, when each gate electrode is made of the conductive film FG that is the single layer as described above, the technique disclosed in the present embodiment is extremely effective.

Second Embodiment

A method of manufacturing a semiconductor device according to a second embodiment will be explained below with reference to FIG. 22. In the following explanation, note that differences from the first embodiment will be mainly explained.

In the first embodiment, as described in FIGS. 7 and 8, the channel region CH1$a$ and the nitrogen-introduction portion NL are formed by using the resist pattern PR1 used in the step of removing a part of the insulating film IF1.

On the other hand, in the second embodiment, the channel region CH1$a$ and the nitrogen-introduction portion NL are formed by using a separately-formed resist pattern PR4 before the formation of the insulating film IF1.

Figure 22:
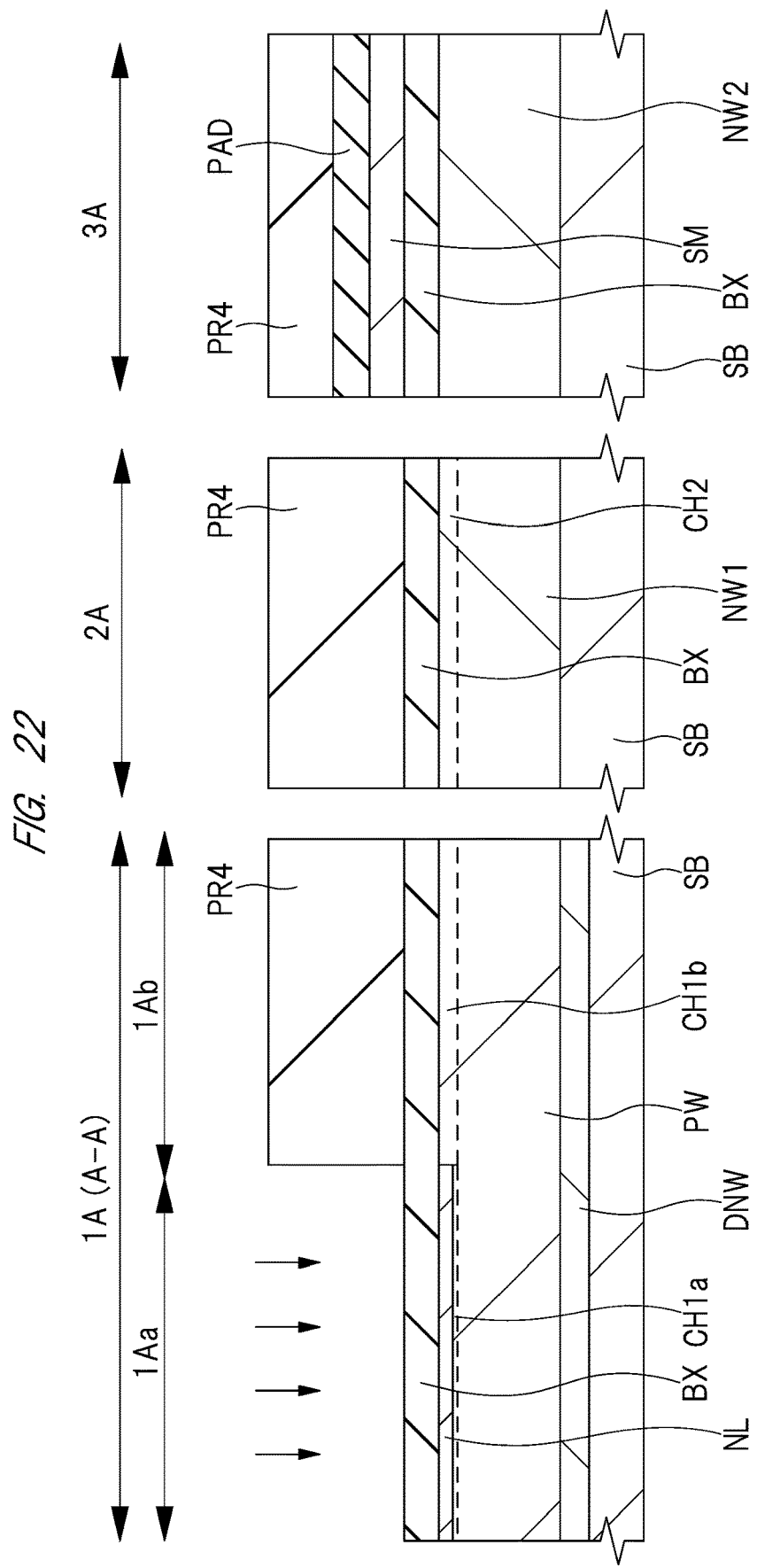
FIG. 22 is a cross-sectional view showing a manufacturing step of a semiconductor device according to a second embodiment.

FIG. 22 shows a manufacturing step continued from FIG. 6 of the first embodiment. First, the resist pattern PR4 having an opening in the region 1A$a$ and covering the regions 1A$b$, 2A and 3A is formed. Next, by ion implantation using the resist pattern PR4 as a mask, the channel region CH1$a$ and the nitrogen-introduction portion NL are formed inside the well PW in the region 1A. Note that a condition of the ion implantation for forming the channel region CH1a and the nitrogen-introduction portion NL is the same as that of the first embodiment.

Then, the step of FIG. 7 and the subsequent steps except for the step of forming the channel region CH1a and the nitrogen-introduction portion NL in the first embodiment are performed, so that the semiconductor device according to the second embodiment is manufactured.

In the second embodiment, since the resist pattern PR4 is separately formed, the manufacturing cost is larger than that of the first embodiment. However, the nitrogen ion implantation for the nitrogen-introduction portion NL can be performed at a separate timing, and therefore, flexibility in the manufacturing steps can be larger.

Third Embodiment

A method of manufacturing a semiconductor device according to a third embodiment will be explained below with reference to FIGS. 23 to 28. In the following explanation, note that differences from the first embodiment will be mainly explained.

In the first embodiment, the insulating film IF1 is formed first, and then, the insulating film IF2, the insulating film IF3 and the insulating film IF4 functioning as the gate insulating film GF1a are formed.

On the other hand, the third embodiment employs a manufacturing method of forming each insulating film functioning as the gate insulating film GF1a first.

Figure 23:
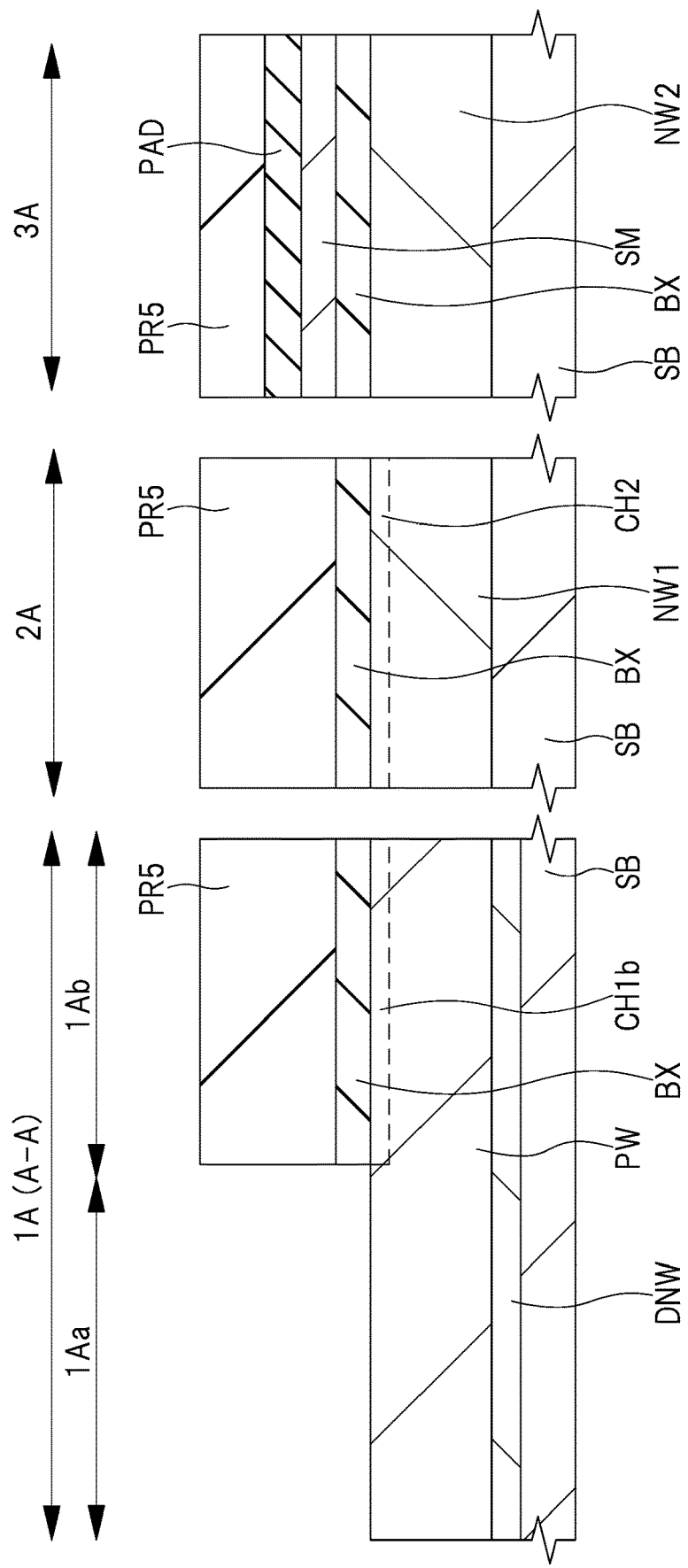
FIG. 23 is a cross-sectional view showing a manufacturing step of a semiconductor device according to a third embodiment.

FIG. 23 shows a manufacturing step continued from FIG. 6 of the first embodiment. First, a resist pattern PR5 having an opening in the region 1Aa and covering the regions 1Ab, 2A and 3A is formed. Next, by an etching process using a resist pattern PR5 as a mask, the insulating layer BX in the region 1Aa is selectively removed to expose the semiconductor substrate SB. At this stage, note that the resist pattern PR5 is not removed and remains.

Figure 24:
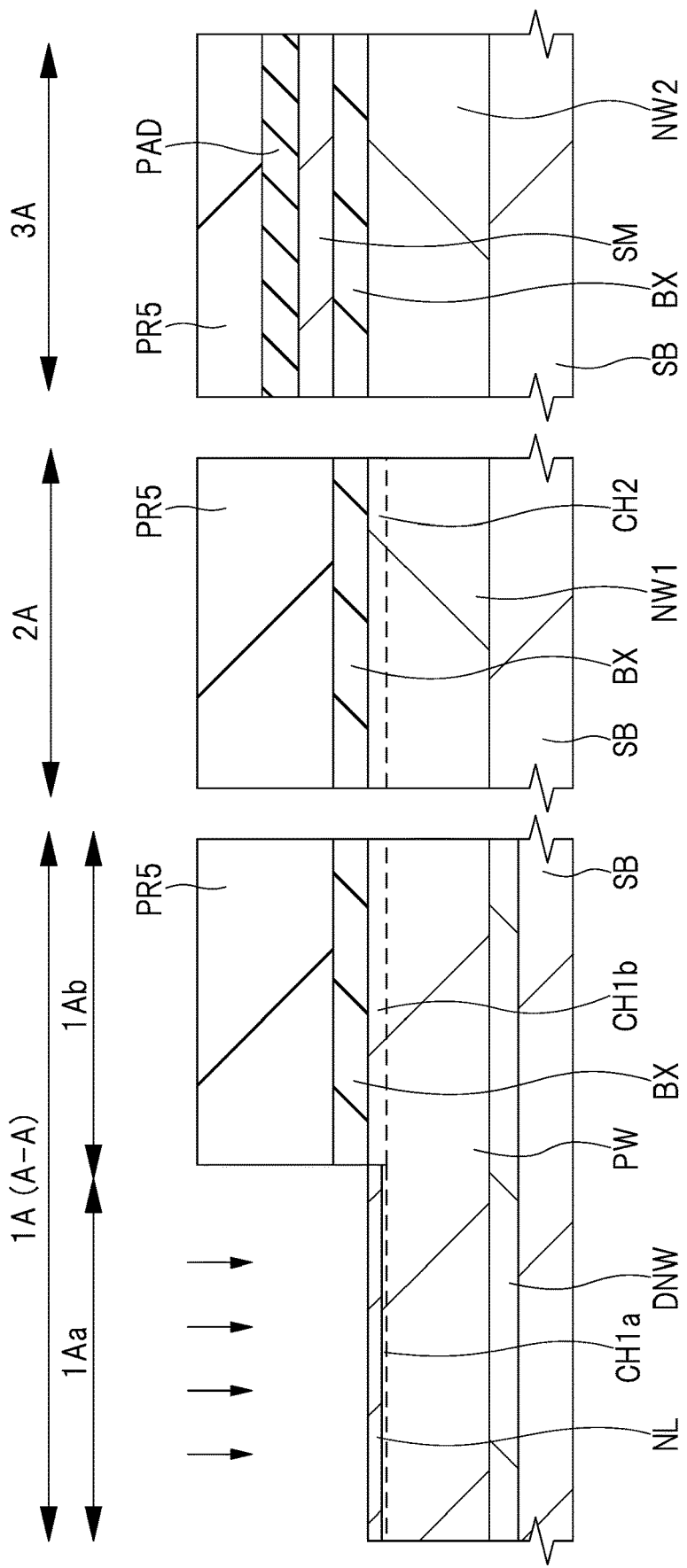
FIG. 24 is a cross-sectional view showing a manufacturing step of the semiconductor device, continued from FIG. 23.

FIG. 24 shows a step of forming the channel region CH1a and the nitrogen-introduction portion NL.

By ion implantation using the resist pattern PR5 used in FIG. 23 as a mask, the channel region CH1a and the nitrogen-introduction portion NL are formed in a surface of the well PW. A condition of the ion implantation used for forming the channel region CH1a and the nitrogen-introduction portion NL is the same as that of the first embodiment.

In the third embodiment, in the step of forming the channel region CH1a and the nitrogen-introduction portion NL in FIG. 24, the resist pattern PR5 used in the step of removing a part of the insulating layer BX in FIG. 23 is also used. Therefore, it is not required to prepare a new mask, so that the manufacturing cost can be reduced.

Then, the resist pattern PR5 is removed by an asking process or others.

Figure 25:
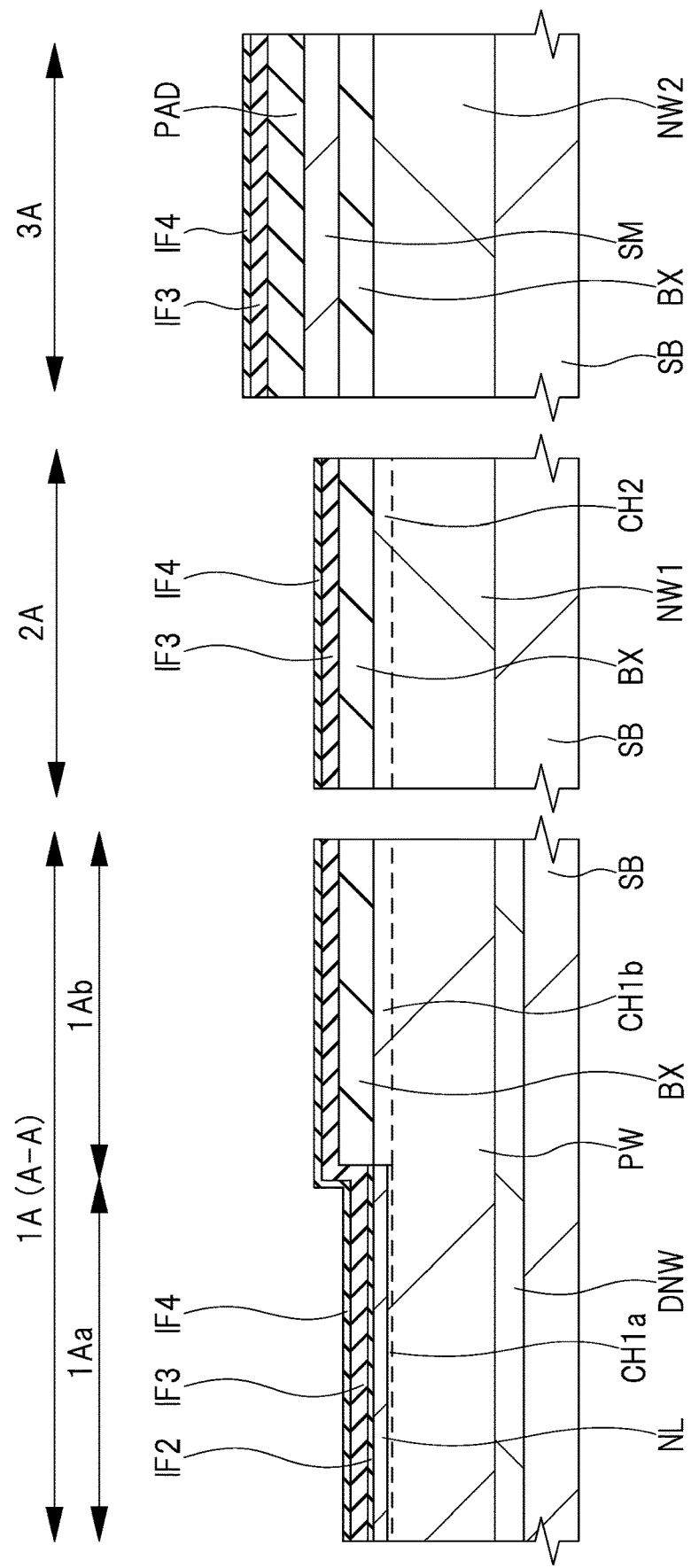
FIG. 25 is a cross-sectional view showing a manufacturing step of the semiconductor device, continued from FIG. 24.

FIG. 25 shows a step of forming the insulating film IF2, the insulating film IF3 and the insulating film IF4. Note that each forming condition and each thickness of these insulating films are the same as those of the first embodiment.

First, on the well PW in the region 1Aa, the insulating film IF2 made of, for example, silicon oxide is formed by using, for example, a thermal oxidation method.

Next, on the insulating film IF2 in the region 1Aa, the insulating film IF3 made of, for example, silicon nitride is formed by using, for example, a CVD method or an ALD method. At this stage, the insulating film IF3 is formed on the insulating layer BX in the regions 1Ab and 2A, and the insulating film IF3 is formed on the insulating film PAD in the region 3A. The insulating film IF3 is a film functioning as the charge storage layer CSL that is a part of the gate insulating film GF1a of the memory transistor MTr in a later step, and is a trap insulating film that can retain the electric charges.

Next, on the insulating film IF3 in the regions 1A to 3A, the insulating film IF4 made of, for example, silicon oxide is formed by using, for example, an ISSG (In-situ Steam Generation) oxidation method.

Figure 26:
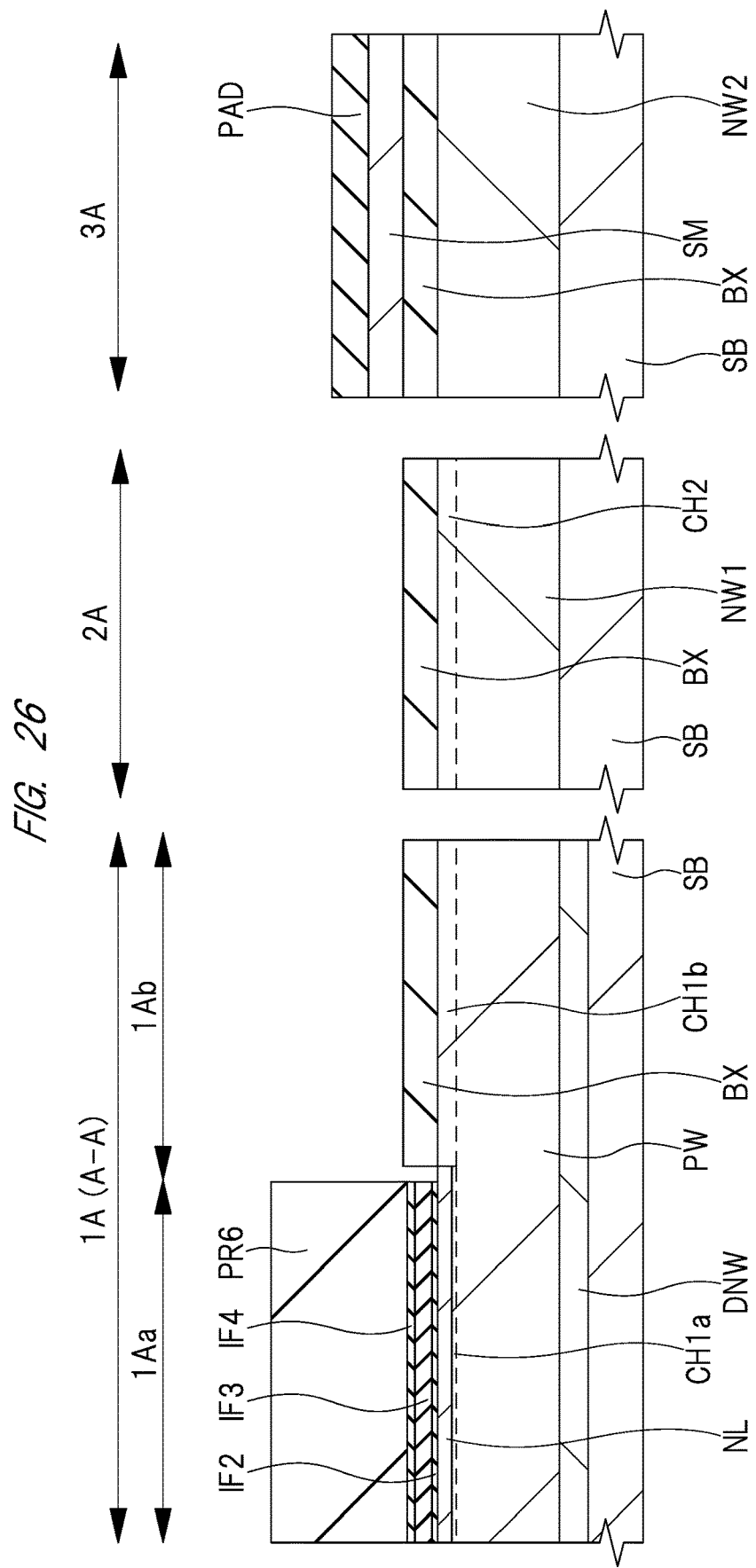
FIG. 26 is a cross-sectional view showing a manufacturing step of the semiconductor device, continued from FIG. 25.

FIG. 26 shows a step of removing the insulating film IF3 and the insulating film IF4.

First, a resist pattern PR6 covering the region 1Aa and having openings in the regions 1Ab, 2A and 3A is formed. Next, by an etching process using the resist pattern PR6 as a mask, the insulating films IF4 and IF3 in the regions 1Ab, 2A and 3A are sequentially removed. The step of removing the insulating film IF4 is performed by a wet etching process using solution containing hydrofluoric acid, and the step of removing the insulating film IF3 is performed by a wet etching process using solution containing phosphoric acid. In this manner, the insulating layer BX is exposed in the regions 1Ab and 2A, and the insulating film PAD is exposed in the region 3A. Then, the resist pattern PR6 is removed by an asking process or others.

Figure 27:
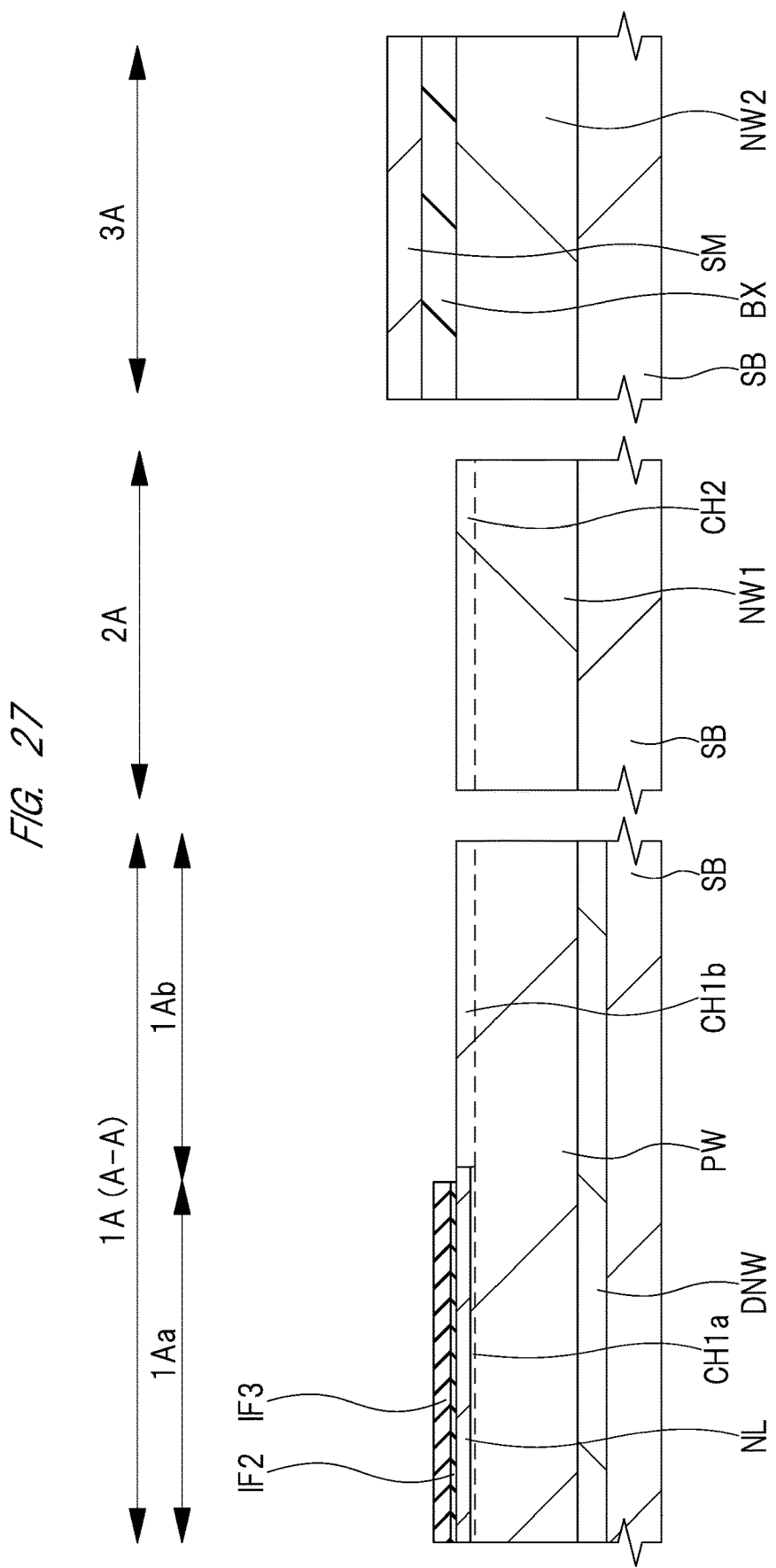
FIG. 27 is a cross-sectional view showing a manufacturing step of the semiconductor device, continued from FIG. 26.

FIG. 27 shows a step of removing the insulating film IF4, the insulating layer BX and the insulating film PAD.

First, by a wet etching process using solution containing hydrofluoric acid, the insulating film IF4 is removed in the region 1Aa, the insulating layer BX is removed in the regions 1Ab and 2A, and the insulating film PAD is removed in the region 3A. In this manner, the insulating film IF3 is exposed in the region 1Aa, the semiconductor substrate SB is exposed in the regions 1Ab and 2A, and the semiconductor layer SM is removed in the region 3A.

Figure 28:
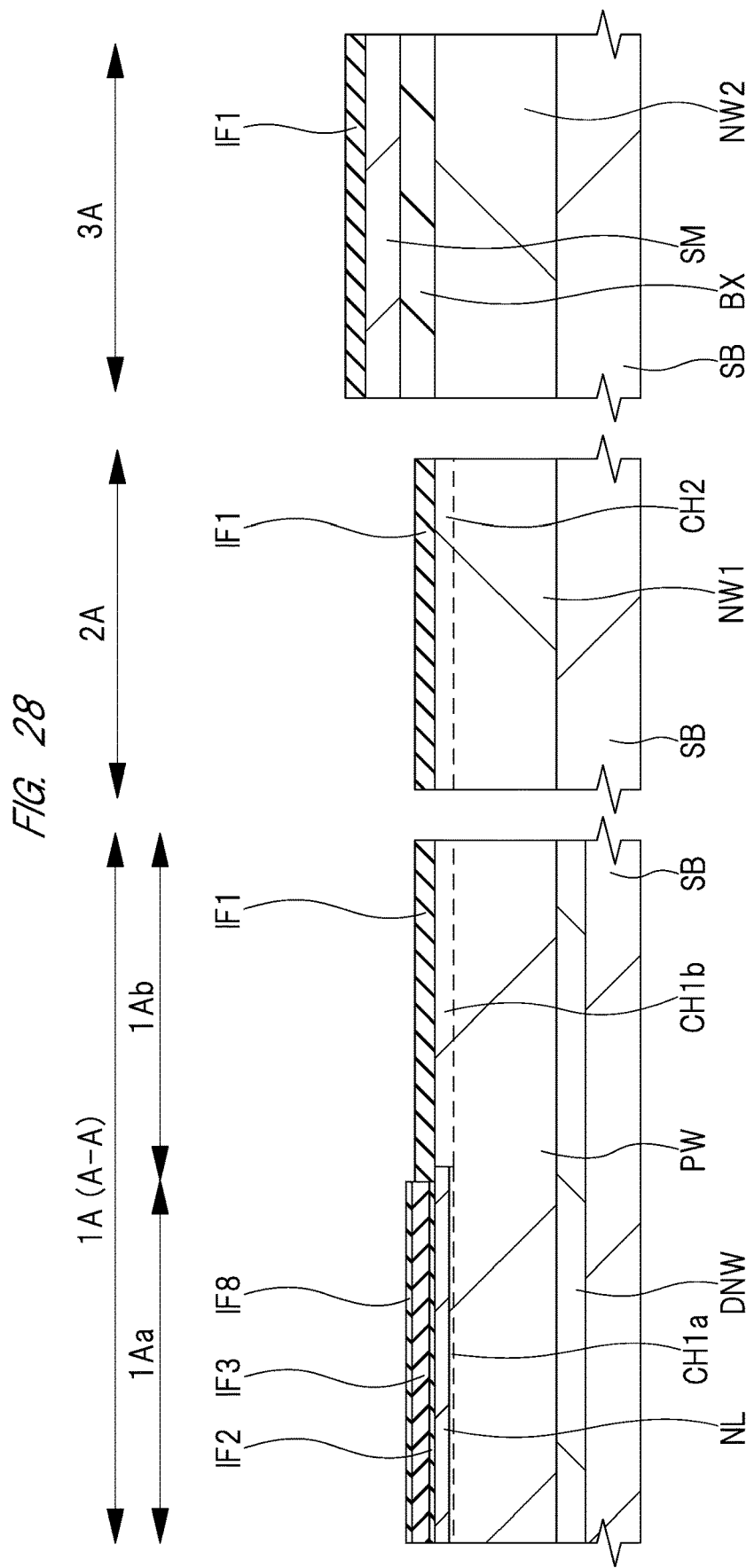
FIG. 28 is a cross-sectional view showing a manufacturing step of the semiconductor device, continued from FIG. 27.

FIG. 28 shows a step of forming the insulating film IF1 and the insulating film IF8.

First, on the semiconductor substrate SB in the regions 1Ab and 2A and on the semiconductor layer SM in the region 3A, the insulating film IF1 is formed by using, for example, a RTO (Rapid Thermal Oxidation) method that is one type of thermal oxidation methods. A thickness of the insulating film IF1 is about 5 nm. At this stage, since the insulating film IF3 in the region 1Aa is made of a silicon nitride film, a portion on the insulating film IF3 is almost not oxidized by the RTO method.

Next, the insulating film IF3 in the region 1Aa is oxidized by the ISSG method, so that the insulating film IF8 is formed on the insulating film IF3. A thickness of the insulating film IF8 is about 3 nm. At this stage, oxidation of the insulating films IF1 in the regions 1Ab, 2A and 3A is accelerated, so that the thickness of each insulating film IF1 is about 7 to 8 nm.

The insulating film IF8 is a film that is equivalent to the insulating film IF4 according to the first embodiment, and becomes the insulating film X2 that is a part of the gate insulating film GF1a in a later step.

Subsequent manufacturing steps are the same as the manufacturing step of FIG. 11 and subsequent steps according to the first embodiment.

As described above, the semiconductor device as similar to that of the first embodiment can be manufactured also by the manufacturing steps of the third embodiment.

In the third embodiment, as explained in FIGS. 23 and 24, after the insulating layer BX in the region 1Aa is selectively removed, the ion implantation for forming the channel region CH1a and the nitrogen-introduction portion NL is performed. However, the ion implantation for them may be performed immediately after the step of FIG. 6 as similar to the second embodiment.

Fourth Embodiment

Figure 29:
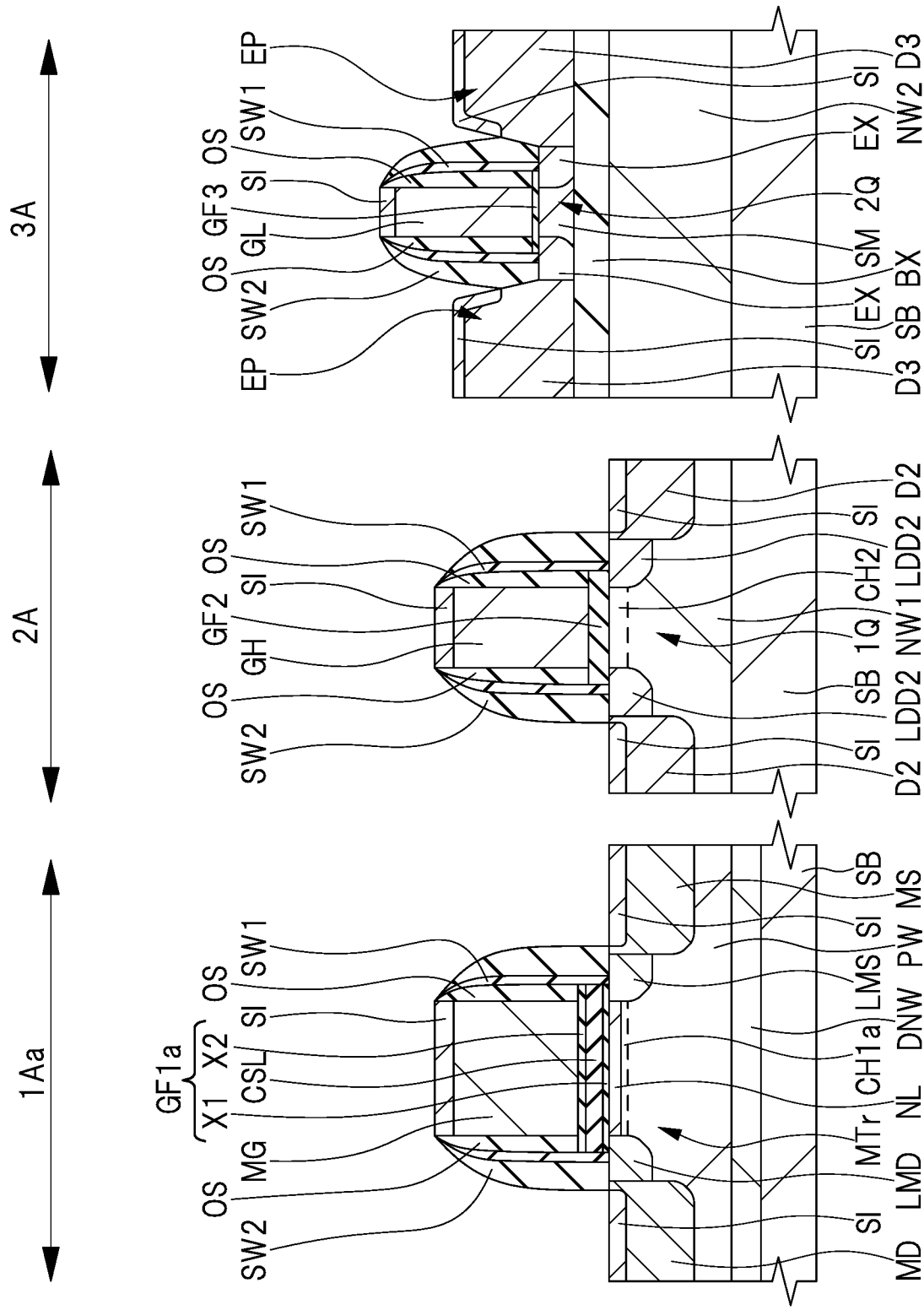
FIG. 29 is a cross-sectional view showing a semiconductor device according to a fourth embodiment.

A semiconductor device according to a fourth embodiment will be explained below with reference to FIG. 29. In the following explanation, note that differences from the first embodiment will be mainly explained.

In the first embodiment, the memory cell MC is configured so as to include the memory transistor MTr and the selection transistor STr.

On the other hand, in the fourth embodiment, the memory cell MC is configured of only the memory transistor MTr. As long as a product in which reliability of the memory cell MC such as disturb is not so strictly required, such a memory cell MC may be applicable. Also in the fourth embodiment, the nitrogen-introduction portion NL can be selectively formed in the channel region CH1a of the memory transistor MTr, and therefore, the same effect as those of other embodiments can be obtained.

A method of manufacturing the semiconductor device according to the fourth embodiment is the same as that of the first embodiment except that there is no selection transistor STr in the region 1Ab, and therefore, explanation thereof is omitted.

In the foregoing, the invention made by the present inventor has been concretely described on the basis of the embodiments. However, the present invention is not limited to the foregoing embodiments and various modifications and alterations can be made within the scope of the present invention.

For example, in the first to fourth embodiments, the memory transistor MTr and the selection transistor STr in the region 1A are formed on the semiconductor substrate SB. However, these transistors may be formed on an SOI substrate such as the region 3A.

What is claimed is:

1. A method of manufacturing a semiconductor device having a first region where a first MISFET being a part of a non-volatile memory cell is formed and a second region where a second MISFET is formed, the method comprising the steps of:
   (a) forming a first well of a first conductivity type in a semiconductor substrate;
   (b) forming a first resist pattern having an opening on the semiconductor substrate in the first region and covering the semiconductor substrate in the second region;
   (c) forming a first channel region of the first MISFET in a surface of the first well in the first region by ion implantation of an impurity of a second conductivity type that is opposite to the first conductivity type;
   (d) forming a nitrogen-introduction portion inside the first channel region by ion implantation of nitrogen using the first resist pattern as a mask;
   (e) after the step (d), removing the first resist pattern;
   (f) after the step (e), forming a first gate insulating film of the first MISFET having a trap insulating film that can retain electric charges, on the first channel region in the first region; and
   (g) after the step (f), forming a first gate electrode of the first MISFET on the first gate insulating film,
   wherein a nitrogen dose amount in the step (d) is greater than an impurity dose amount in the step (c).

2. The method of manufacturing the semiconductor device according to claim 1, wherein a nitrogen concentration of the nitrogen-introduction portion is $1 \times 10^{20}$ to $2 \times 10^{20}$/cm$^3$.

3. The method of manufacturing the semiconductor device according to claim 2, wherein, in the step (d), ion implantation for forming the nitrogen-introduction portion is performed under a condition in which the nitrogen dose amount is a range of from $5 \times 10^{14}$ to $1 \times 10^{15}$/cm$^2$.

4. The method of manufacturing the semiconductor device according to claim 3,
   wherein the first channel region of the first MISFET is formed by ion implantation of arsenic, and
   wherein, in the step (c), ion implantation for forming the first channel region is performed under a condition in which an arsenic dose amount is in a range that is equal to or lower than $2 \times 10^{12}$/cm$^2$.

5. The method of manufacturing the semiconductor device according to claim 1, further comprising the steps of:
   (h) before the step (b), forming a first insulating film on the semiconductor substrates in the first region and the second region; and
   (i) between the step (d) and the step (e), removing the first insulating film in the first region by an etching process using the first resist pattern as a mask,
   wherein, in the step (b), the first resist pattern is formed on the first insulating film in the second region.

6. The method of manufacturing the semiconductor device according to claim 1,
   wherein the first gate insulating film has a first silicon oxide film formed on the semiconductor substrate, the trap insulating film that is a silicon nitride film formed on the first silicon oxide film, and a second silicon oxide film formed on the trap insulating film, and
   wherein nitrogen is introduced from the nitrogen-introduction portion into the first silicon oxide film.

7. The method of manufacturing the semiconductor device according to claim 6, wherein a writing operation or an erasing operation to the non-volatile memory cell is performed by using FN tunnel phenomenon.

8. The method of manufacturing the semiconductor device according to claim 7,
   wherein the semiconductor device has a third region where a third MISFET is formed,
   wherein the first MISFET forms a memory transistor of the non-volatile memory cell,
   wherein the third MISFET forms a selection transistor of the non-volatile memory cell, and,
   wherein in the step (b), the first resist pattern covers the third region.

9. The method of manufacturing the semiconductor device according to claim 1, further comprising the steps of:
   (j) before the step (a), preparing the semiconductor substrate, an insulating layer formed on the semiconductor substrate, and a semiconductor layer formed on the insulating layer;
   (k) between the step (j) and the step (a), removing the semiconductor layers in the first region and the second region; and
   (l) between the step (b) and the step (c), removing the insulating layer in the first region by an etching process using the first resist pattern as a mask,
   wherein, in the step (b), the first resist pattern is formed on the insulating layer in the second region.

10. The method of manufacturing the semiconductor device according to claim 1, wherein, in the step (g), by patterning a first conductive film, the first gate electrode is formed in the first region, and a second gate electrode of the second MISFET is formed in the second region.

11. The method of manufacturing the semiconductor device according to claim 1,
wherein the first MISFET is an n-type transistor, and
wherein the second MISFET is a p-type transistor.

12. The method of manufacturing the semiconductor device according to claim 1, wherein each of the first MISFET and the second MISFET is an n-type transistor.

13. The method of manufacturing the semiconductor device according to claim 1, wherein, after the step (e) and before the step (f), impurities contained in the first channel region are activated by performing a thermal process to the semiconductor substrate.

14. The method of manufacturing the semiconductor device according to claim 13, wherein the thermal process is performed under a condition at 950° C. about 1 minute.

15. The method of manufacturing the semiconductor device according to claim 1, wherein the step (d) is performed after the step (c).

* * * * *